(12) United States Patent
Asano

(10) Patent No.: US 6,538,834 B2
(45) Date of Patent: Mar. 25, 2003

(54) SERVO CONTROLLER AND SERVO CONTROL METHOD

(75) Inventor: Shigetaka Asano, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/187,944

(22) Filed: Jul. 3, 2002

(65) Prior Publication Data

US 2002/0180628 A1 Dec. 5, 2002

Related U.S. Application Data

(62) Division of application No. 09/782,297, filed on Feb. 14, 2001, now Pat. No. 6,462,686.

(30) Foreign Application Priority Data

Jun. 19, 2000 (JP) ........................................ 2000-183297
Sep. 18, 2000 (JP) ........................................ 2000-281696

(51) Int. Cl.[7] ............................................... G11B 5/09
(52) U.S. Cl. ............................ 360/46; 360/25; 360/51; 360/65; 360/67; 360/77.07; 360/77.08; 324/76.52; 324/76.53; 324/76.54; 324/76.55; 324/76.82; 341/139; 341/155
(58) Field of Search ............................... 341/139, 155; 324/76.52, 76.53, 76.54, 76.55, 76.82; 360/25, 46, 51, 65, 67, 77.07, 77.08

(56) References Cited

U.S. PATENT DOCUMENTS

| | | | |
|---|---|---|---|
| 4,829,593 A | 5/1989 | Hara | 455/234 |
| 5,418,660 A | 5/1995 | Sato et al. | 360/65 |
| 5,546,245 A | 8/1996 | Sato | 360/65 |
| 5,742,899 A | 4/1998 | Blackburn et al. | 455/234.2 |
| 5,796,544 A * | 8/1998 | McMurtrey | 360/77.07 |
| 5,870,591 A * | 2/1999 | Sawada | 713/500 |
| 6,002,352 A | 12/1999 | El-Ghoroury et al. | 341/139 |
| 6,037,886 A | 3/2000 | Staszewski et al. | 341/139 |
| 6,038,435 A | 3/2000 | Zhang | 455/234.1 |
| 6,052,244 A * | 4/2000 | Haraguchi et al. | 360/46 |
| 6,198,587 B1 * | 3/2001 | Hayashi | 360/65 |

* cited by examiner

Primary Examiner—Michael Tokar
Assistant Examiner—Khai M. Nguyen
(74) Attorney, Agent, or Firm—Arent Fox Kintner Plotkin & Kahn, PLLC

(57) ABSTRACT

A servo controller for correcting a read position of a head when reading data recorded on a recording medium. In accordance with the amplitude ratio of data signals read from each segment of a servo section defined on a recording medium, the servo controller generates an AGC signal corresponding to the next segment before reading the next segment. The data signal read from a phase detection segment of the servo section is amplified to an amplitude greater than the predetermined determination range. The amplified data signal is converted to a two-value digital signal in accordance with the determination range. The phase used during servo control is calculated in accordance with the digital signal.

25 Claims, 29 Drawing Sheets

| D1 | ... 1 -1 -1 -1 -1  1  1  1  1 -1 -1 -1 ... |
|---|---|
| D2 | ... 0 -1 -1 -1  0  1  1  1  0 -1 -1 -1 ... |
| D3 (NG) | ... 1 -1 -1 -1 -1 -1  1  1  1 -1 -1 -1 ... |
| D4 (NG) | ... 0 -1 -1 -1 -1  1  1  0 -1 -1 -1 -1 ... |

| Sample No. | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| DA1 | 1 | 1 | 0 | -1 | -1 | -1 | 1 | 1 | 1 | 1 | 0 | -1 | -1 | -1 | 0 | 1 |

(b)

| Correction Order No. | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|
| D2a | 0 | -1 | -1 | -1 | 0 | 1 | 1 | 1 | 0 | -1 | -1 | -1 | 0 | 1 | 1 | 1 | 0 | -1 | -1 | -1 | 0 | 1 | 1 | 1 |

(c)

| Correction Order No. | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|
| DA1 | 1 | 1 | 0 | -1 | -1 | -1 | 1 | 1 | 1 | 1 | 0 | -1 | -1 | -1 | 0 | 1 | | | | | | | | 1 |
| D2a | 0 | -1 | -1 | -1 | 0 | 1 | 1 | 1 | 0 | -1 | -1 | -1 | 0 | 1 | 1 | 1 | 0 | -1 | -1 | -1 | 0 | 1 | 1 | 1 |
| Absolute Value of Difference | 1 | 2 | 1 | 0 | 1 | 2 | 0 | 0 | 1 | 2 | 1 | 0 | 1 | 2 | 1 | 0 | | | | | | | | |

Sum=15

(d)

| Correction Order No. | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|
| DA1 | 1 | 1 | 0 | -1 | -1 | -1 | 1 | 1 | 1 | 1 | 0 | -1 | -1 | -1 | 0 | 1 | | | | | | | | 1 |
| D2a | 0 | -1 | -1 | -1 | 0 | 1 | 1 | 1 | 0 | -1 | -1 | -1 | 0 | 1 | 1 | 1 | 0 | -1 | -1 | -1 | 0 | 1 | 1 | 1 |
| Absolute Value of Difference | 2 | 2 | 2 | 1 | 1 | 2 | 2 | 0 | 2 | 2 | 2 | 1 | 1 | 2 | 2 | 1 | | | | | | | | |

Sum=23

| Correction Order No. | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|
| DA1 |  |  | 1 | 1 | 0 | -1 | -1 | -1 | 1 | 1 | 1 | 1 | 0 | -1 | -1 | -1 | 0 | 1 | 1 | 1 |  |  |  |  |
| D2a | 0 | -1 | -1 | -1 | 0 | 1 | 1 | 1 | 1 | 0 | -1 | -1 | 0 | 1 | 1 | 1 | 0 | -1 | -1 | -1 | 0 | 1 | 1 | 1 |
| Absolute Value of Difference |  |  | 2 | 2 | 0 | 2 | 2 | 2 | 0 | 1 | 2 | 2 | 0 | 2 | 2 | 2 | 0 | 2 | 2 | 2 |  |  |  |  |

Sum = 25

(b)

| Correction Order No. | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|
| DA1 |  |  | 1 | 1 | 1 | 0 | -1 | -1 | -1 | -1 | 1 | 1 | 1 | 0 | -1 | -1 | -1 | 0 | 1 | 1 | 0 |  |  |  |
| D2a | 0 | -1 | -1 | -1 | 0 | 1 | 1 | 1 | 1 | 0 | -1 | -1 | 0 | 1 | 1 | 1 | 0 | -1 | -1 | -1 | 0 | 1 | 1 | 1 |
| Absolute Value of Difference |  |  | 2 | 2 | 1 | 1 | 2 | 2 | 2 | 1 | 2 | 2 | 1 | 1 | 2 | 2 | 1 | 1 | 2 | 2 |  |  |  |  |

Sum = 25

(c)

| Correction Order No. | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|
| DA1 |  |  | 1 | -1 | 1 | 1 | 1 | 0 | -1 | -1 | 1 | 1 | 1 | 0 | 0 | -1 | 0 | -1 | -1 | 0 | 0 |  |  |  |
| D2a | 0 | -1 | -1 | -1 | 1 | 0 | 1 | 2 | 1 | 0 | 2 | 2 | 2 | 0 | 1 | 2 | 1 | 0 | 1 | 2 | 0 | 1 | 1 | 1 |
| Absolute Value of Difference |  |  |  |  | 1 | 1 | 1 | 1 | 1 | 1 | 2 | 2 | 1 | 1 | 1 | 1 | 1 | 1 | 1 | 1 |  |  |  |  |

Sum = 17

| Correction Order No. | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|
| DA1 | | | | | | 1 | 1 | 0 | -1 | -1 | -1 | 1 | 1 | 1 | 1 | 0 | -1 | -1 | -1 | 0 | 1 | 1 | | |
| D2a | 0 | -1 | -1 | -1 | 0 | 1 | 1 | 1 | 0 | -1 | -1 | -1 | 0 | 1 | 1 | 1 | 0 | -1 | -1 | -1 | 0 | 1 | 1 | 1 |
| Absolute Value of Difference | | | | | | 0 | 0 | 1 | 1 | 0 | 0 | 2 | 1 | 0 | 0 | 1 | 1 | 0 | 0 | 1 | 1 | 0 | | |

Sum=9

(b)

| Correction Order No. | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|
| DA1 | | | | | | 1 | 1 | 1 | 0 | -1 | -1 | -1 | 0 | 1 | 1 | 1 | 0 | -1 | -1 | -1 | 0 | 1 | 1 | |
| D2a | 0 | -1 | -1 | -1 | 0 | 1 | 1 | 1 | 0 | -1 | -1 | -1 | 0 | 1 | 1 | 1 | 0 | -1 | -1 | -1 | 0 | 1 | 1 | 1 |
| Absolute Value of Difference | | | | | | 0 | 0 | 0 | 0 | 0 | 0 | 0 | 0 | 0 | 0 | 0 | 0 | 0 | 0 | 0 | 0 | 0 | | |

Sum=1

(c)

| Correction Order No. | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|
| DA1 | | | | | | 1 | 1 | 1 | 0 | -1 | -1 | -1 | 0 | 1 | 1 | 1 | 0 | -1 | -1 | -1 | 0 | 1 | 1 | |
| DA2 | | | | | | 1 | 1 | 1 | 0 | -1 | -1 | -1 | 0 | 1 | 1 | 1 | 0 | -1 | -1 | -1 | 0 | 1 | 1 | |

Fig.32

| t | SG3a | SG3b | SG3c | SG3d | n |
|---|---|---|---|---|---|
| 0 | -0.30902 | -0.03664 | 0.6022175 | 0.4017221 | 0 |
| 0.785398 | 0.45399 | 0.468391 | 0.8987666 | -0.590188 | 1 |
| 1.570796 | 0.951057 | 0.699041 | 0.6688303 | -1.236373 | 2 |
| 2.356194 | 0.891007 | 0.520201 | 0.0471024 | -1.158308 | 3 |
| 3.141593 | 0.309017 | 0.036635 | -0.602218 | -0.401722 | 4 |
| 3.926991 | -0.45399 | -0.46839 | -0.898767 | 0.5901876 | 5 |
| 4.712389 | -0.95106 | -0.69904 | -0.66883 | 1.2363735 | 6 |
| 5.497787 | -0.89101 | -0.5202 | -0.047102 | 1.1583085 | 7 |

Fig.33

| t | SG3a | SG3b | SG3c | SG3d |
|---|---|---|---|---|
| x0-x4 | -2.47214 | -0.29308 | 4.81774 | 3.2137771 |
| x1-x3-x5+x7 | -3.49613 | -0.41448 | 6.813314 | 4.544967 |
| (x1-x3-x5+x7)*0.7071 | -2.47211 | -0.29308 | 4.817694 | 3.213746 |
| Real number | -4.94425 | -0.58616 | 9.635435 | 6.427523 |
| x2-x6 | 7.608452 | 5.592325 | 5.350643 | -9.89099 |
| x1+x3-x5-x7 | 10.75998 | 7.908742 | 7.566952 | -13.988 |
| (x1+x3-x5-x7)*0.7071 | 7.608379 | 5.592272 | 5.350591 | -9.89089 |
| Imaginary number-j | -15.2168 | -11.1846 | -10.7012 | 19.78188 |
| P1 | -108 | -93 | -48 | 72 |
| PD1 | | -15 | -45 | -120 |
| PD2 | | -15 | -60 | -180 |

| t | SG13a | SG13b | SG13c | SG13d | n |
|---|---|---|---|---|---|
| 0 | -1 | 0 | 1 | 1 | 0 |
| 0.785398 | 1 | 1 | 1 | -1 | 1 |
| 1.570796 | 1 | 1 | 1 | -1 | 2 |
| 2.356194 | 1 | 1 | 0 | -1 | 3 |
| 3.141593 | 1 | 0 | -1 | -1 | 4 |
| 3.926991 | -1 | -1 | -1 | 1 | 5 |
| 4.712389 | -1 | -1 | -1 | 1 | 6 |
| 5.497787 | -1 | -1 | 0 | 1 | 7 |

| t | SG13a | SG13b | SG13c | SG13d |
|---|---|---|---|---|
| x0-x4 | -8 | 0 | 8 | 8 |
| x1-x3-x5+x7 | 0 | 0 | 8 | 0 |
| (x1-x3-x5+x7)×0.7071 | 0 | 0 | 5.6568 | 0 |
| Real number | -8 | 0 | 13.6568 | 8 |
| x2-x6 | 8 | 8 | 8 | -8 |
| x1+x3-x5-x7 | 16 | 16 | 8 | -16 |
| (x1+x3-x5-x7)×0.7071 | 11.3136 | 11.3136 | 5.6568 | -11.3136 |
| Imaginary number-j | -19.3136 | -19.3136 | -13.6568 | 19.3136 |
| P1 | -112.5 | -90 | -45 | 67.49989 |
| PD1 |  | -22.5001 | -45 | -112.5 |
| PD2 |  | -22.5001 | -67.5001 | -180 |

Fig.38

| t | SG13a | SG13b | SG13c | SG13d | n |
|---|---|---|---|---|---|
| 0 | 0 | 1 | 3 | 3 | 0 |
| 0.785398 | 3 | 3 | 3 | 0 | 1 |
| 1.570796 | 3 | 3 | 3 | 0 | 2 |
| 2.356194 | 3 | 3 | 2 | 0 | 3 |
| 3.141593 | 3 | 2 | 0 | 0 | 4 |
| 3.926991 | 0 | 0 | 0 | 3 | 5 |
| 4.712389 | 0 | 0 | 0 | 3 | 6 |
| 5.497787 | 0 | 0 | 1 | 3 | 7 |

Fig.39

| t | SG13a | SG13b | SG13c | SG13d |
|---|---|---|---|---|
| x0-x4 | -12 | -4 | 12 | 12 |
| x1-x3-x5+x7 | 0 | 0 | 8 | 0 |
| (x1-x3-x5+x7)×0.7071 | 0 | 0 | 5.6568 | 0 |
| Real number | -12 | -4 | 17.6568 | 12 |
| x2-x6 | 12 | 12 | 12 | -12 |
| x1+x3-x5-x7 | 24 | 24 | 16 | -24 |
| (x1+x3-x5-x7)×0.7071 | 16.9704 | 16.9704 | 11.3136 | -16.9704 |
| Imaginary number-j | -28.9704 | -28.9704 | -23.3136 | 28.9704 |
| P1 | -112.5 | -9.78612 | -52.8611 | 67.49989 |
| PD1 |  | -14.6389 | -45.0001 | -120.361 |
| PD2 |  | -14.6389 | -59.639 | -180 |

```
If Y>=0 begin
    If X>=0 begin
        If X>=Y       ISOU=1
        If Y>X        ISOU=2
    End
    If X<0 begin
        If Y>|X|      ISOU=3
        If |X|>=Y     ISOU=4
    End
End
If Y<0 begin
    If X<0 begin
        If |X|>=|Y|   ISOU=5
        If |Y|>|X|    ISOU=6
    End
    If X>=0 begin
        If |Y|>X      ISOU=7
        If X>=|Y|     ISOU=8
    End
End
```

| D1 | -1 | -1 | -1 | -1 | -1 | 1 | 1 | 1 |
|---|---|---|---|---|---|---|---|---|
| Angle | 67.5 | 112.5 | 157.5 | -157.5 | -112.5 | -67.5 | -22.5 | 22.5 |
| D2 | 0 | -1 | -1 | -1 | 0 | 1 | 1 | 1 |
| Angle | 90 | 135 | 180 | -135 | -90 | -45 | 0 | 45 |

SERVO CONTROLLER AND SERVO CONTROL METHOD

This is a Division of application Ser. No. 09/782,297 filed Feb. 14, 2001 now U.S. Pat. No. 6,462,686. The disclosure of the prior application(s) is hereby incorporated by reference herein in its entirety.

BACKGROUND OF THE INVENTION

The present invention relates to a servo controller and a method for controlling a servo. More particularly, it relates to a servo controller that controls an embedded servo by providing servo sections in a data recording surface of a recording medium, such as a magnetic disk.

FIG. 1 is a schematic block diagram of a prior art servo controller 50. The servo controller 50 reads data from a recording medium, such as a magnetic disk.

The servo controller 50 includes an automatic gain control (AGC) circuit 1, a D/A converter 2, a filter circuit 3, an A/D converter 4, a servo processing circuit 5, and an AGC circuit controller 6.

The AGC circuit 1 receives an input signal IN, which includes data read by a recording medium by a read head (not shown). The AGC circuit 1 sets its gain based on an AGC voltage SG1 supplied from the D/A converter 2, amplifies the input signal IN based on the gain, and sends an amplified data signal SG2 to the filter circuit 3.

The filter circuit 3, including a low-pass filter, eliminates unnecessary high frequency components in the amplified data signal SG2 so to generate a filtered signal SG3, and provides the filtered signal SG3 to the A/D converter 4. The A/D converter 4 converts the filtered data signal SG3 to a digital data signal SG4, and provides the digital data signal SG4 to the servo processing circuit 5 and the AGC circuit controller 6.

The servo processing circuit 5 servo-controls the read position of the read head based on the digital data signal SG4. The servo processing circuit 5 includes a discrete Fourier transform (DFT) operational circuit (not shown). The DFT operational circuit performs a discrete Fourier transform on the digital data signal SG4 to generate phase data PD. The phase data PD is used to servo-control the read position of the read head.

In addition to the digital data signal SG4, the AGC circuit controller 6 is provided with a target value PA, which is pre-stored in a register, or the like. The target value PA generates the filtered data signal SG3 so that its amplitude is substantially equal to the full-scale range of the input level of the A/D converter 4. The AGC circuit controller 6 compares the digital data signal SG4 and the target value PA, integrates the error component to generate an integral signal SG5, and sends the integral signal SG5 to the D/A converter 2.

The D/A converter 2 converts the integral signal SG5 to an analog signal, and provides the AGC circuit 1 with the AGC voltage SG1.

The A/D converter 4, the servo processing circuit 5, and the AGC circuit controller 6 are operated in accordance with a clock signal CLK, which is generated by a PLL circuit.

Servo sections are locally defined in each track of a recording medium, such as a magnetic disk. FIG. 2 illustrates one of the servo sections. The servo section includes an R/W recovery segment 7, a servo mark segment 8, an AGC segment 9, and a phase detection segment 10. FIG. 3 is a diagram illustrating the waveform of the signal IN in the servo section. Although the signal IN of the servo section actually has a Lorentz waveform, the signal IN is illustrated as having a sin wave for the sake of brevity.

With reference to FIG. 3, when the servo section is read, the R/W recovery segment 7 is read during a first time period t1. The signal IN has a predetermined amplitude and frequency during the first time period t1. Then, the servo mark segment 8 is read during a second time period t2. The signal IN has a continuous null level during the second time period t2.

In comparison to the R/W recovery segment 7, the signal IN has a lower frequency and a greater amplitude when the AGC segment 9 is read during a third time period t3. When the phase detection segment 10 is read during a fourth time period t4, the frequency and amplitude of the signal IN are the same as the frequency and amplitude of the signal IN when the AGC segment 9 is read.

FIG. 4 is a combined timing and waveform chart of the AGC voltage SG1 when the servo section is read.

When the read head starts reading the R/W recovery segment 7, the AGC circuit controller 6 calculates the error between the digital data signal SG4, which corresponds to the input signal IN, and the target value PA. Based on the digital integral signal SG5 generated by the AGC circuit controller 6, the D/A converter 2 supplies the AGC circuit 1 with the AGC voltage SG1.

If the amplitude of the input signal IN of the R/W recovery segment 7 is small and the error between the digital data signal SG4 and the target value PA is large, the level of the AGC voltage SG1 increases. As a result, the digital data signal SG4 becomes the target value PA.

When the servo mark segment 8 is read and the input signal IN has a continuous null level, the digital data signal SG4 is accordingly generated at a continuous, null level. This fixes the integral signal SG5 and the AGC voltage SG1.

Then, when the reading of the AGC segment 9 is started, the error between the digital data signal SG4, which corresponds to the input signal IN, and the target value PA is recalculated by the AGC circuit controller 6. The D/A converter 2 then supplies the AGC circuit 1 with the AGC voltage SG1 in accordance with the integral signal SG5 of the D/A converter 2.

When the reading shifts from the servo mark segment 8 to the AGC segment 9, the amplitude of the read signal IN becomes greater than that when the R/W recovery segment 7 is read. Thus, the amplitude of the filtered data signal SG3, which is generated by the filter circuit 3, exceeds a target value.

As a result, the AGC circuit controller 6 gradually decreases the AGC voltage SG1 until the digital signal SG4 converges to the target value PA. In a state in which the amplitude of the filtered data signal SG3 is substantially equal to the full-scale range of the A/D converter 4, the reading of the phase detection segment 10 is started.

The signal IN has the same frequency and amplitude when the phase detection segment 10 and the AGC segment 9 are read. Thus, the phase detection segment 10 is read in a state in which the A/D converter 4 is provided from the beginning with the substantially full-scale range, filtered data signal SG3. Thus, the reading of the phase information stored in the phase detection segment 10 is guaranteed, and servo-control, which corrects the read position, is immediately performed.

In this manner, the servo controller 50 amplifies the input signal IN, which corresponds to the data read from the recording medium. The servo controller 50 then extracts the filtered data signal SG3, including a fundamental wave from the amplified data signal SG2. Further, the servo controller 50 performs the discrete Fourier transform on the digital data signal SG4, which is the converted filtered data signal SG3, to obtain the phase data PD. Based on the phase data PD, the servo controller 50 performs phase servo to position the read head.

However, when the servo section is read, the AGC voltage SG1 is shifted whenever the read segment is changed to provide the A/D converter 4 with the substantially, full-range filtered data signal SG3. Therefore, whenever the read segment of the servo section changes, time is required for the amplitude of the filtered data signal SG3 to substantially converge to the full-scale range input level of the A/D converter 4. As a result, it is difficult to compress the servo section and shorten the read time.

When starting the reading of the phase detection segment 10, to provide the A/D converter 4 with the substantially, full-scale range filtered data signal SG3 from the beginning, the AGC segment 9 must have a sufficient amount of sample data and data storage space.

Further, as the density and reading speed of the recording medium increase, the high-speed rotation of the recording medium causes the input signal IN provided to the servo controller 50 to have a relatively high frequency. Thus, the AGC circuit 1, the filter circuit 3, and the D/A converter 2, all of which are analog circuits, must be adaptable to the relatively high frequency. However, an analog circuit adaptable to a high frequency is complicated. Consequently, the manufacture of such a circuit is difficult. Further, to decrease power consumption and prevent the temperature of the device from becoming excessively high, the power supply voltage must be low. However, a low power supply voltage renders phase calculation of the servo controller 50 to be susceptible to noise.

Further, with reference to FIG. 5, when the reproduction device of a recording medium is configured by a system LSI, in addition to the servo controller 50, a microprocessor 51, and a digital signal processor (DSP) 52 are formed on a single semiconductor chip 60. In this case, the noise of the microprocessor 51 is increased, due to being mixed with the analog signals (IN, SG1, SG2, SG3) of the servo controller 50. Thus, it is difficult to incorporate the servo controller 50 in the system LSI.

SUMMARY OF THE INVENTION

It is a first object of the present invention to provide a servo controller and a servo control method that provides the reading of servo data recorded on a servo section of a recording medium and compresses the servo section to increase the amount of recording data.

It is a second object of the present invention to provide a phase calculator and a method for calculating a phase that are adaptable to a high frequency input signal of the recording medium and decrease the effects resulting from noise.

To achieve the above objects, the present invention provides a servo controller for correcting a read position of a read head that reads data recorded on a recording medium. A servo section is defined on the recording medium. The servo section includes a plurality of segments. The servo controller includes an automatic gain control (AGC) circuit for generating an amplified data signal having a predetermined amplitude from data signals that have different amplitudes and are read from the segments of the servo section. The amplified data signal is generated in accordance with a predetermined AGC voltage to generate an amplified data signal having a predetermined amplitude. A filter circuit is connected to the AGC circuit. The filter circuit eliminates unnecessary frequency elements from the amplified data signal to generate a filtered data signal. An A/D converter is connected to the filter circuit. The A/D converter converts the filtered data signal to a digital data signal. An AGC circuit controller is connected to the A/D converter. The AGC circuit controller generates an AGC signal to control the gain of the AGC circuit in accordance with the digital data signal. A D/A converter is connected to the AGC circuit controller. The D/A converter converts the AGC signal to an analog signal so to generate an AGC voltage, which is supplied to the AGC circuit. The AGC circuit controller generates the AGC signal corresponding to the next segment in accordance with an amplification ratio between the data signals read from each of the segments of the servo section, before reading the next segment.

The present invention further provides a servo controller for correcting a read position of a read head that reads data recorded on a recording medium. A servo section is defined on the recording medium. The servo section includes an R/W recovery segment, a servo mark segment, an AGC segment, and a phase detection segment. The servo controller includes an AGC circuit for generating an amplified data signal having a predetermined amplitude from data signals that have different amplitudes and are read from the R/W recovery segment, the servo mark segment, the AGC segment, and the phase detection segment. The amplified data signal is generated in accordance with an AGC voltage. A filter circuit is connected to the AGC circuit. The filter circuit eliminates unnecessary frequency elements from the amplified data signal to generate a filtered data signal. An A/D converter is connected to the filter circuit. The A/D converter converts the filtered data signal to a digital data signal. An AGC circuit controller is connected to the A/D-converter. The AGC circuit controller generates an AGC signal to control the gain of the AGC circuit in accordance with the digital data signal. A D/A converter is connected to the AGC circuit controller. The D/A converter converts the AGC signal to an analog signal to generate an AGC voltage, which is supplied to the AGC circuit. The AGC circuit controller generates the AGC signal corresponding to one of the AGC segment and the phase detection segment in accordance with an amplitude ratio between an amplitude of a first data signal, which is read from the R/W recovery segment, and an amplitude of a second data signal, which is read from one of the AGC segment and the phase detection segment, before reading the one of the AGC segment and the phase detection segment.

The present invention further provides a first servo control method for correcting a read position of a read head that reads data recorded on a recording medium. A servo section is defined on the recording medium. The servo section includes an R/W recovery segment, a servo mark segment, an AGC segment, and a phase detection segment. The method includes generating an amplified data signal having a predetermined amplitude from data signals that have different amplitudes and are read from the R/W recovery segment, the servo mark segment, the AGC segment, and the phase detection segment. The amplified data signal is generated in accordance with an AGC voltage. The method further includes generating a filtered data signal by eliminating unnecessary frequency elements from the amplified data signal, generating a digital data signal by A/D converting the filtered data signal, generating an AGC signal to control the gain of the AGC circuit in accordance with the digital data signal, and generating the AGC voltage by converting the AGC signal to an analog signal. The AGC signal generating step includes generating the AGC signal corresponding to one of the AGC segment and the phase detection segment in accordance with an amplitude ratio between an amplitude of a first data signal, which is read from the R/W recovery segment, and an amplitude of a second data signal, which is read from one of the AGC segment and the phase detection segment, before reading the one of the AGC segment and the phase detection segment.

The present invention further provides a second servo control method for correcting a read position of a read head that reads data recorded on a recording medium. A servo section is defined on the recording medium. The servo section includes an R/W recovery segment, a servo mark segment, an AGC segment, and a phase detection segment. The method includes generating an amplified data signal having a predetermined amplitude from data signals that have different amplitudes and are read from the R/W recovery segment, the servo mark segment, the AGC segment, and the phase detection segment. The amplified data signal is generated in accordance with an AGC voltage. The method further includes generating a filtered data signal by eliminating unnecessary frequency elements from the amplified data signal, generating a digital data signal by A/D converting the filtered data signal, generating an AGC signal to control the gain of the AGC circuit in accordance with the digital data signal, and generating the AGC voltage by converting the AGC signal to an analog signal. The AGC signal generating step includes storing a first AGC signal when the AGC voltage converges to a predetermined value during the reading of the R/W recovery segment and storing a second AGC signal when the AGC control voltage converges to a predetermined value during the reading of the AGC segment. The AGC generating step also includes generating the AGC signal in correspondence with at least one of the AGC segment and the phase detection segment, before reading the at least one of the AGC segment and the phase detection segment with a firmware in accordance with the stored first and second AGC signals.

The present invention further provides a first method for calculating a phase of a signal. The method includes generating an amplified input signal, which includes a fundamental wave of an input signal, by amplifying the input signal with a high gain, and converting the amplified input signal to a multiple-value digital signal using at least one determination level. The determination level is lower than the peak of the amplified input signal. The method further includes calculating the phase of the fundamental wave of the input signal using the digital signal.

The present invention further provides a second method for calculating a phase of a signal. The method includes generating an amplified input signal, which includes a fundamental wave of an input signal, by amplifying the input signal with a high gain. The amplitude of the amplified input signal is greater than a predetermined determination range. The method further includes converting the amplified input signal to a digital signal having at least two-values in accordance with the determination range, and calculating the phase of the fundamental wave of the input signal using the digital signal.

The present invention further provides a phase calculator for calculating a phase of a signal. The phase calculator includes an amplifier for generating an amplified input signal, which includes a fundamental wave of an input signal, by amplifying the input signal with a predetermined gain. A comparator is connected to the amplifier. The comparator compares at least one determination level with the amplified input signal to generate a determination signal having a digital data string that includes two or more values. A phase calculation circuit is connected to the comparator. The phase calculation circuit calculates the phase of the input signal in accordance with the determination signal. The determination level includes a maximum value and a minimum value. The predetermined gain of the amplifier is set such that the amplitude of the amplified input signal exceeds the maximum and minimum values of the determination level.

The present invention further provides an alternative phase calculator for calculating a phase of a signal. The phase calculator includes an amplifier for generating an amplified input signal, which includes a fundamental wave of an input signal, by amplifying the input signal with a predetermined gain. A comparator is connected to the amplifier. The comparator compares the amplified input signal with a predetermined input range to generate a determination signal having a digital data string that includes two or more values. A phase calculation circuit is connected to the comparator. The phase calculation circuit calculates the phase of the input signal in accordance with the determination signal. The gain of the amplifier is set so that the amplitude of the amplified input signal is excluded from the input range.

The present invention further provides a method for testing a phase calculator. The phase calculator amplifies an input signal with a predetermined gain to generate an amplified input signal; compares the amplified input signal with at least one determination level; generates a digital data string having two or more values; and calculates a phase of the input signal with the digital data string. The testing method includes connecting a digital signal generator, which generates a rectangular wave, to the phase calculator, and providing the rectangular wave as the input signal to the phase calculator. The functions of the phase calculator are tested in accordance with the rectangular wave.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 29 is a first chart used to illustrate data string correction;

FIG. 30 is a second chart used to illustrate data string correction;

FIG. 31 is a third chart used to illustrate data string correction;

FIG. 32 is a table illustrating an input signal sampling result;

FIG. 33 is a table used to illustrate phase calculation;

FIG. 38 is a table illustrating another example of the comparator output;

FIG. 39 is a table illustrating phase calculation in accordance with the comparator output of FIG. 38;

DETAILED DESCRIPTION OF THE PREFERRED EMBODIMENTS

Figure 1:
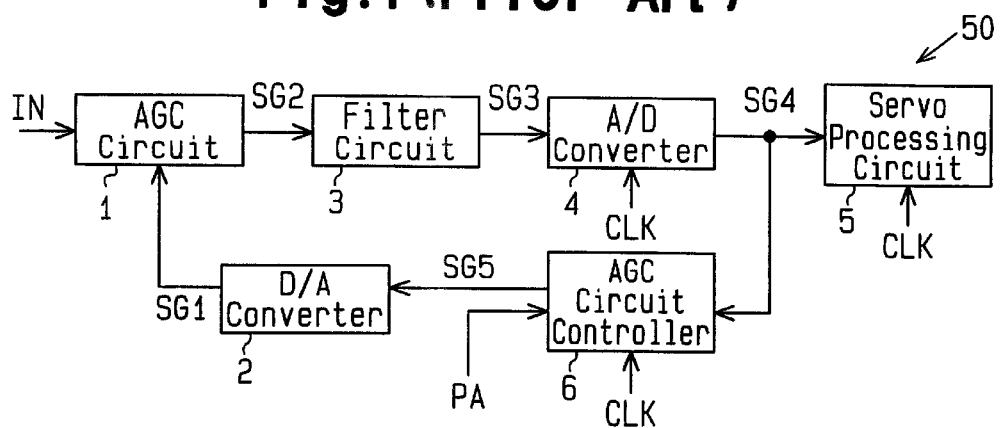
FIG. 1 is a schematic block diagram of a prior art servo controller.

In the drawings, like numerals are used for like elements throughout.

[First Embodiment]

Figure 6:
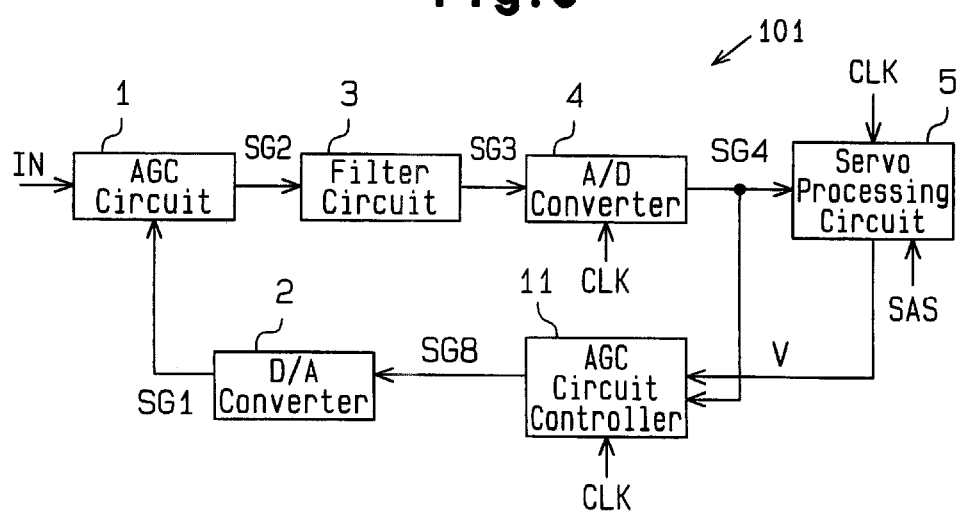
FIG. 6 is a schematic block diagram of a servo controller according to a first embodiment of the present invention.

FIG. 6 is a schematic block diagram of a servo controller 101 according to a first embodiment of the present invention. The servo controller 101 is similar to the conventional servo controller 50, except for the AGC circuit controller 11. The servo controller 101 is applied to a device (not shown) for reading data recorded on a recording medium, such as a magnetic disk.

Figure 7:
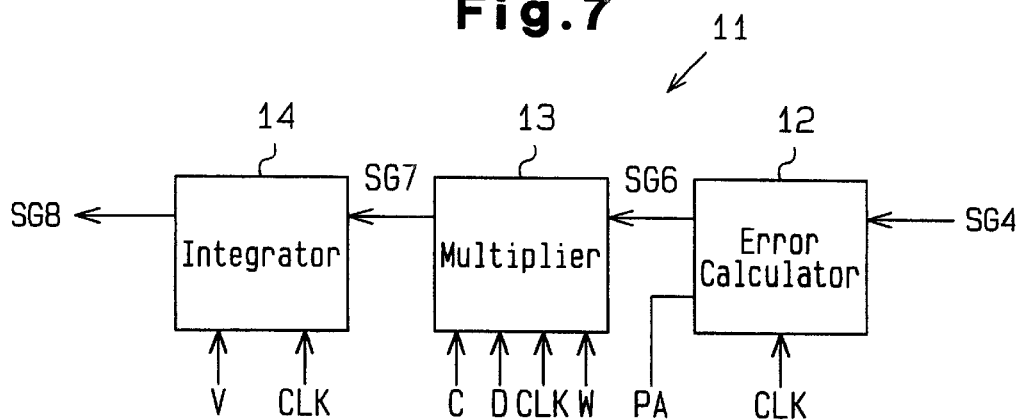
FIG. 7 is a schematic block diagram of an AGC circuit controller of the servo controller of FIG. 6.

Referring to FIG. 7, the AGC circuit controller 11 includes an error calculator 12, a multiplier 13, and an integrator 14. The error calculator 12 receives the digital data signal SG4 from the A/D converter 4, the clock signal CLK, and the target value PA. The error calculator 12 sequentially calculates the error between the digital signal SG4 and the target value PA in correspondence with the clock signal CLK. Further, the error calculator 12 sequentially calculates the average value of two consecutive errors and provides the multiplier 13 with the average value as an error signal SG6 in accordance with the clock signal CLK.

Figure 8:
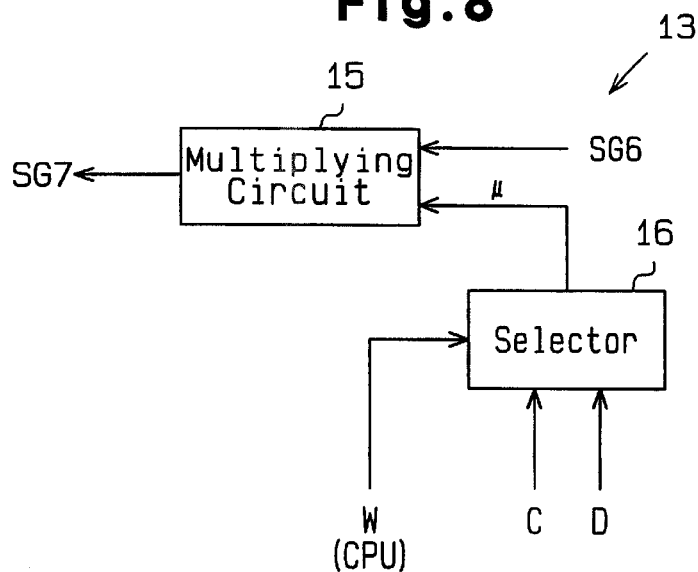
FIG. 8 is a schematic block diagram of a multiplier of the AGC circuit controller of FIG. 7.
Figure 10:
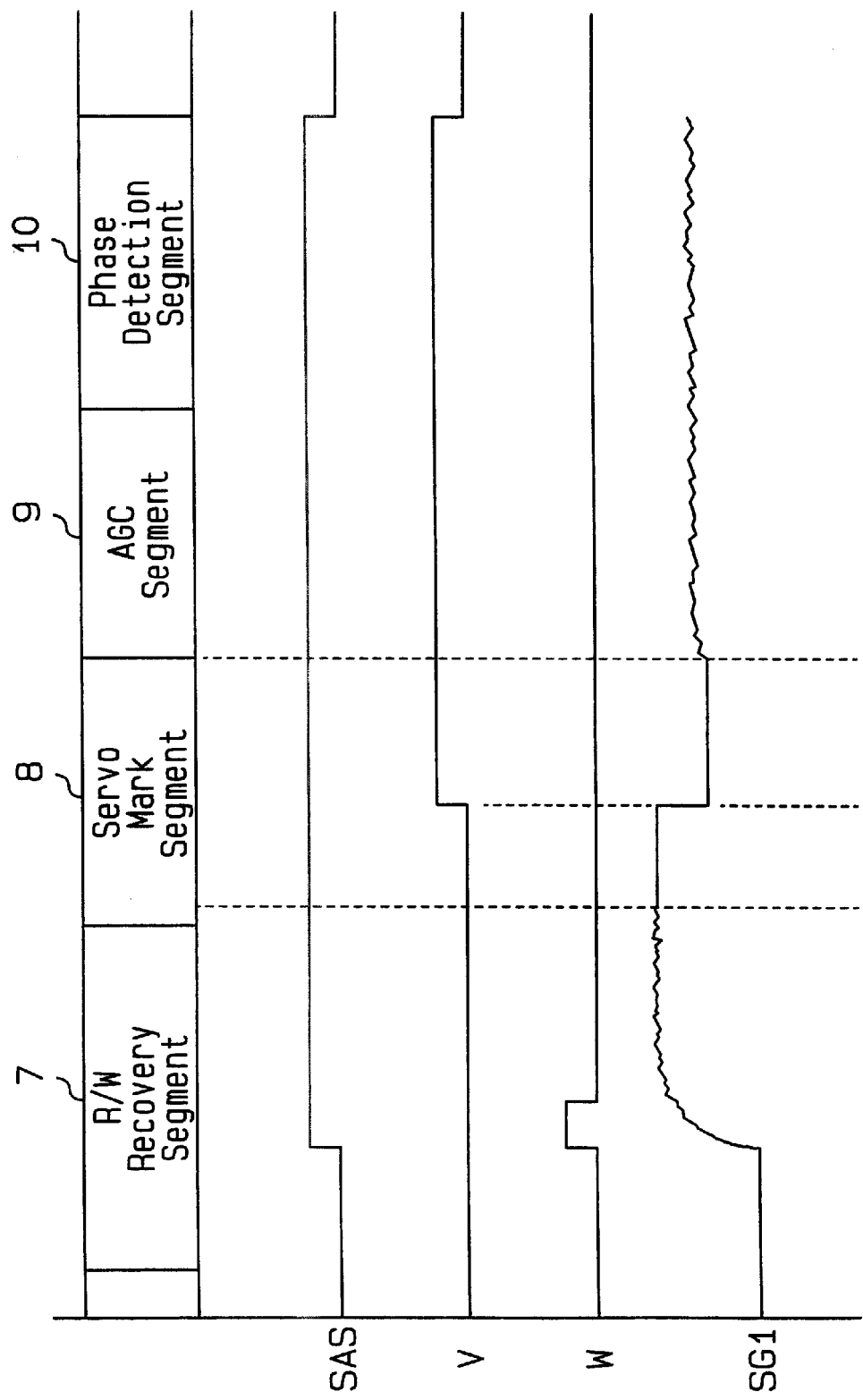
FIG. 10 is a combined timing and waveform chart illustrating the operation of the servo controller of FIG. 6.

Referring to FIG. 8, the multiplier 13 includes a multiplying circuit 15 and a selector 16. The multiplying circuit 15 receives a coefficient $=82$ from the selector 16 and error signal SG6. The selector 16 receives coefficients C, D and a high-speed matching signal W, which are pre-stored in a register (or the like) of the data reading device. The coefficients C, D are set such that condition C>D is satisfied. With reference to FIG. 10, the high-speed matching signal W is provided from a CPU of the data reading device, and is a pulse signal that goes high when the R/W recovery segment 7 is read.

In FIG. 8, when the high-speed matching signal W is high, the selector 16 provides the multiplying circuit 15 with the value C as the coefficient $\mu$. When the high-speed matching signal W is low, the selector 16 provides the multiplying circuit 15 with the value D as the coefficient $\mu$. The multiplying circuit 15 multiplies the error signal SG6 by the coefficient $\mu$ and provides the integrator 14 with a multiplied signal SG7.

Figure 9:
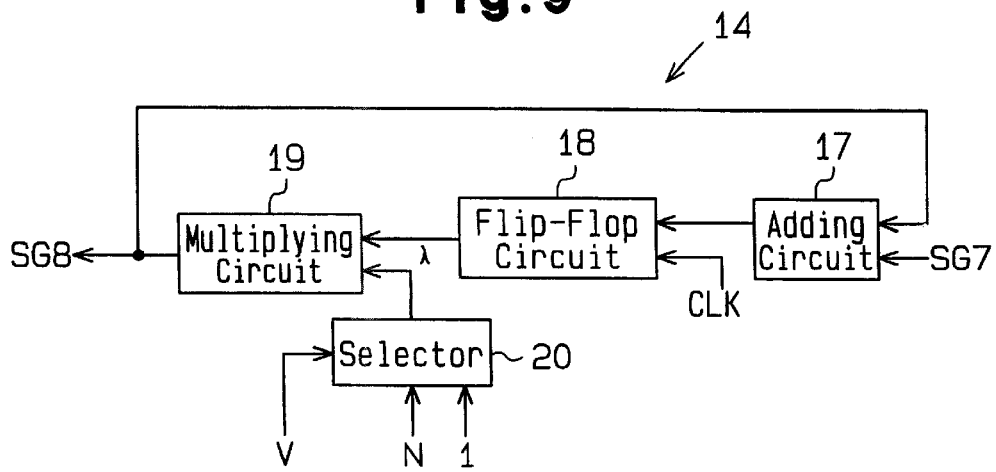
FIG. 9 is a schematic block diagram of an integrator of the AGC circuit controller of FIG. 7.

With reference to FIG. 9, the integrator 14 includes an adding circuit 17, a flip-flop circuit 18, a multiplying circuit 19, and a selector 20. The adding circuit 17 receives an AGC signal SG8 from the multiplying circuit 19 and the multiplied signal SG7. The adding circuit 17 adds the multiplied signal SG7 and the AGC signal SG8, and provides the flip-flop circuit 18 with the added signal. In correspondence with the clock signal CLK, the flip-flop circuit 18 provides the multiplying circuit 19 with the added signal of the adding circuit 17.

The multiplying circuit 19 receives a coefficient λ from the selector 20. The selector 20 receives a servo mark detection signal V, and values N and 1, which are pre-stored in a register. If the level of the servo mark detection signal V is high, the selector 20 provides the multiplying circuit 19 with value N as the coefficient λ. If the level of the servo mark detection signal V is low, the selector 20 provides the multiplying circuit 19 with value 1 as the coefficient λ.

Value N represents a ratio between the amplitude of the input signal IN when the R/W recovery segment 7 is read and the amplitude of the input signal IN when the AGC segment 9 is read. The ratio is a constant, and may be pre-measured. For example, if the amplitude of the signal IN read from the AGC segment 9 is n times the amplitude of the signal IN read from the R/W recover segment 7, the value N is set at 1/n.

The multiplying circuit 19 multiplies the output signal of the flip-flop circuit 18 with the coefficient λ and provides the adding circuit 17 and the D/A converter 2 with the AGC signal SG8. The integrator 14 generates the AGC signal SG8 by either integrating the multiplied signal SG7 of the multiplier 13, or by integrating and multiplying by N times the multiplied signal SG7.

The operation of the servo controller will now be discussed. FIG. 10 is a combined timing and waveform chart illustrating the operation of the servo controller 101.

When reading a magnetic disk(or the like), if the reading of data from the servo section starts, a CPU (not shown) for controlling the data reading device causes a servo section signal SAS to go high, wherein SAS is sent to the servo processing circuit 5. When the servo section signal SAS goes high, the CPU provides the selector 16 of the multiplier 13 with a high pulse signal, or the AGC high-speed matching signal W.

Figure 3:
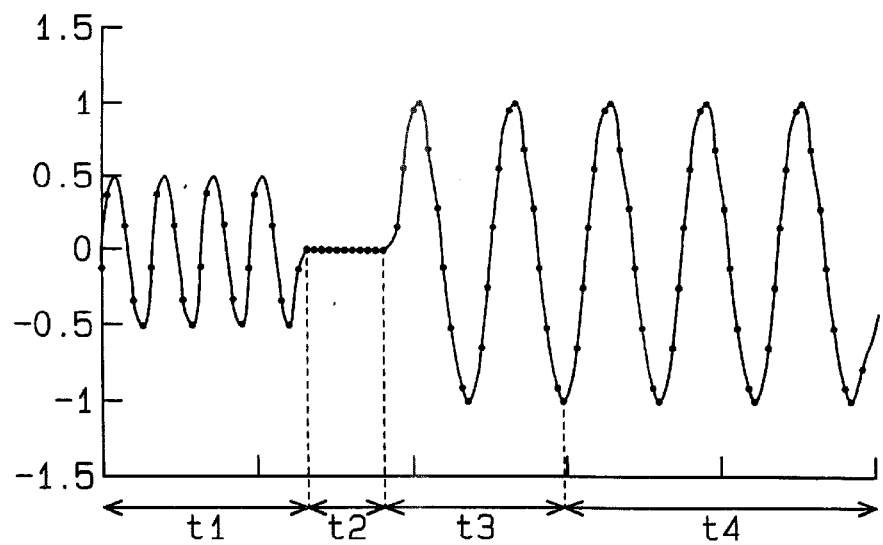
FIG. 3 is a chart illustrating a waveform of an input signal of the servo controller of FIG. 1.
Figure 4:
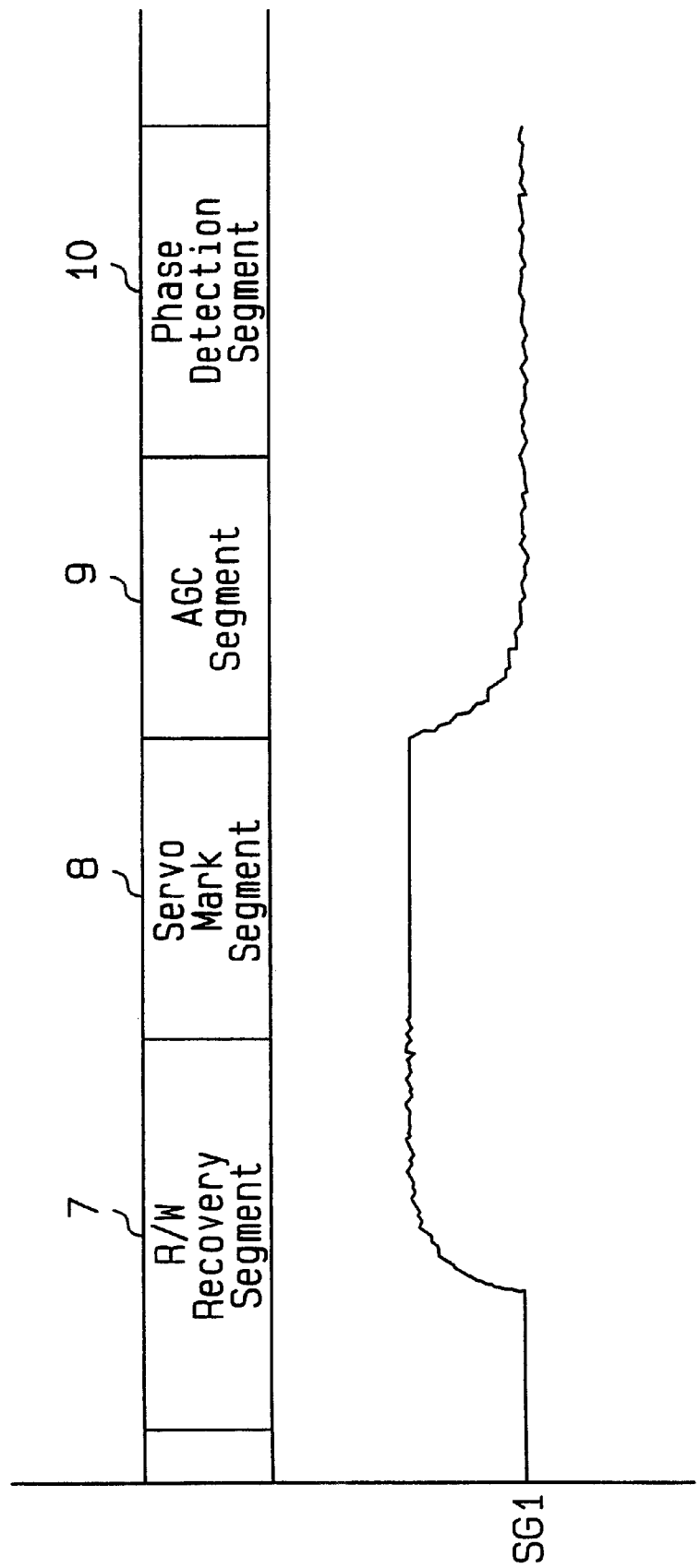
FIG. 4 is a combined timing and waveform chart illustrating the operation of the servo controller of FIG. 1.
Figure 5:
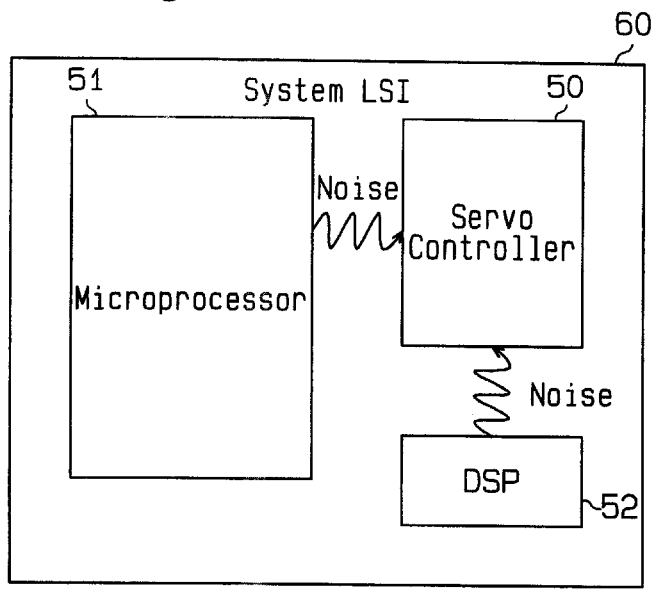
FIG. 5 is a schematic block diagram of a system LSI.

When the input signal IN, whose amplitude and frequency correspond to the R/W recovery segment 7, is provided to the servo controller 101 during the first time period t1 (FIG. 3), the input signal IN is provided to the A/D converter 4 via the AGC circuit 1 and the filter circuit 3. The A/D converter 4 converts the filtered data signal SG3 to the digital data signal SG4 and provides the servo processing circuit 5 and the AGC circuit controller 11 with the digital data signal SG4.

In the AGC circuit controller 11, the error calculator 12 calculates the average value of the errors between the digital output signal SG4 and the target value PA. Then, the error calculator 12 provides the multiplier 13 with the average value as the error signal SG6.

When the AGC high-speed matching signal W received by the selector 16 is high, the selector 16 provides the multiplying circuit 15 with a coefficient μ, which has a large value C. The error signal SG6 is multiplied by the coefficient μ so that the multiplier 13 provides the integrator 14 with the multiplied signal SG7.

Since the servo mark detection signal V is still low in this state, as shown in FIG. 10, the integrator 14 integrates the multiplied signal SG7 with the coefficient λ, which takes the value of 1, and the D/A converter 2 is provided with the AGC signal SG8.

The D/A converter 2 converts the AGC signal SG8 to an analog signal to generate the AGC voltage SG1. The D/A converter 2 then supplies the AGC circuit 1 with the control voltage SG1.

With reference to FIG. 10, after the reading of the R/W recovery segment 7 is started, the AGC voltage SG1 increases in a sudden manner when the AGC high-speed matching signal W goes high. The filtered data signal SG3 generated by the filter circuit 3 is converged so that its amplitude becomes substantially equal to the full-scale range of the A/D converter 4 (see FIG. 3). This converges the digital signal SG4 generated by the A/D converter 4 to the target value PA.

Then, when the reading of the servo mark segment 8 is started during time period t2, the value of the error signal SG6 becomes null when the AGC circuit controller 11 is consecutively provided with a signal having a null level for an h number of times. In this state, the levels of the AGC signal SG8 and the AGC voltage SG1 are constant.

When the servo mark segment 8 is read and the selector 20 of the integrator 14 receives the servo mark detection signal V from the servo processing circuit 5, the selector 20 provides the multiplying circuit 19 with the coefficient λ, which takes the value of N. In this state, the AGC signal SG8 instantaneously decreases in accordance with a predetermined ratio. Thus, as shown in FIG. 10, the AGC voltage SG1 also instantaneously decreases to a constant level.

When the servo mark segment 8 is read, the integrator 14 generates the AGC signal SG8, which corresponds to the AGC segment 9, in a precedent manner.

When the reading of the AGC segment 9 starts during time period t3 and the input signal IN having a large amplitude is input to the servo controller 101, the error calculator 12 obtains the error between the digital data signal SG4 and the target value PA. Due to the AGC voltage SG1, which is set when the AGC segment 9 is read, the maximum value of the digital data signal SG4 of the A/D converter 4 has already been approximated with the target value PA in this state. Thus, the amplitude of the filtered data signal SG3 generated by the filter circuit 3 is close to the full-scale range of the input level of the A/D converter 4.

Then, during time period t4, the reading of the phase detection segment 10 is started. The data stored in the phase detection segment 10 is accurately converted to a digital signal by the A/D converter 4 and provided to the servo processing circuit 5.

The servo controller 101 has the advantages described below.

(1) When the servo mark segment 8 is read, the AGC voltage SG1 is shifted in accordance with the ratio (existing value) between the amplitude of the input signal IN read from the R/W recovery segment 7 and the amplitude of the input signal IN read from the AGC segment 9. This approximates the maximum value of the digital output signal SG4 of the A/D converter 4 to the target value PA when the reading of the AGC segment 9 is started.

(2) When the reading of the AGC segment 9 is started, the maximum value of the digital data signal SG4 is approximated with the target value PA. Thus, the phase detection segment 10 is accurately read even if the size of the AGC segment 9 is decreased. Further, even if the AGC segment 9 is eliminated and the phase detection segment 10 is arranged immediately after the servo mark segment 8, the phase detection data recorded at the phase detection segment 10 is read accurately.

(3) The AGC segment 9 may have a smaller size, or be eliminated. This decreases the amount of data in the servo section and allows the recording capacity of the data section to increase. Thus, the recording capacity of the recording medium also increases.

(4) When the R/W recovery segment 7 is read, the multiplier 13 is provided with the high-speed matching signal W. This changes the AGC voltage SG1 in a sudden manner, and causes the average value of the digital data signal SG4 of the A/D converter 4 to immediately approach the target value PA.

[Second Embodiment]

Figure 11:
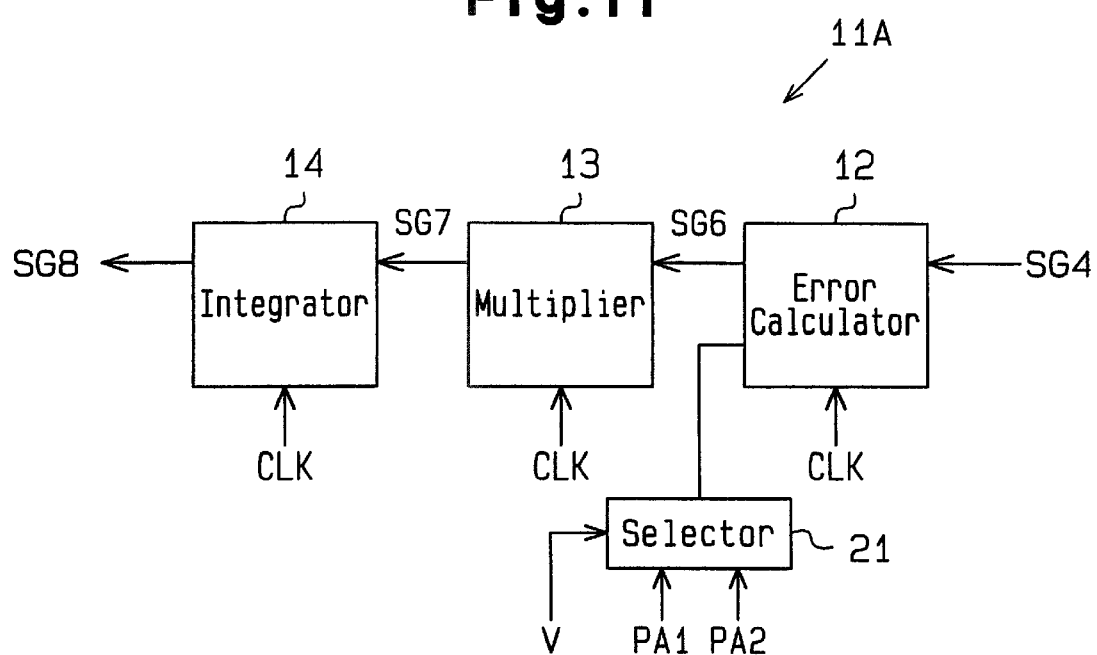
FIG. 11 is a schematic block diagram of a servo controller according to a second embodiment of the present invention.

FIG. 11 is a schematic block diagram of an AGC circuit controller 11A employed in a servo controller 102 according to a second embodiment of the present invention. The servo controller 102 of the second embodiment is identical to the servo controller 101 of the first embodiment, except for the AGC circuit controller 11A, which differs from the AGC circuit controller 11. The error calculator 12 of the AGC controller 11A is provided with two target values PA1, PA2 and the coefficient λ. The coefficient λ is provided to the multiplying circuit 19 of the integrator 14, and is fixed to the value of 1.

The selector 21 receives the two predetermined target values PA1, PA2, which are preset in a register, and the servo mark detection signal V. The selector 21 provides the error calculator 12 with the target value PA1 when the servo mark detection signal V is low, and provides the error calculator 12 with the target value PA2 when the servo mark detection signal V is high.

The target values PA1, PA2 are set in accordance with ratio between the amplitude of the signal IN read from the R/W recovery segment 7 and the amplitude of the signal IN read from the AGC segment 9. The target value PA1 is set so that when the R/W recover segment 7 is read, the filtered data SG3 is generated in a manner that its amplitude is substantially equal to the full-scale range of the input level of the A/D converter 4. For example, if the ratio between the amplitudes of the signal IN read from the R/W recovery segment 7 and the AGC segment 9 is 1:2, the ratio between the target values PA1, PA2 is 1:2.

Figure 12:
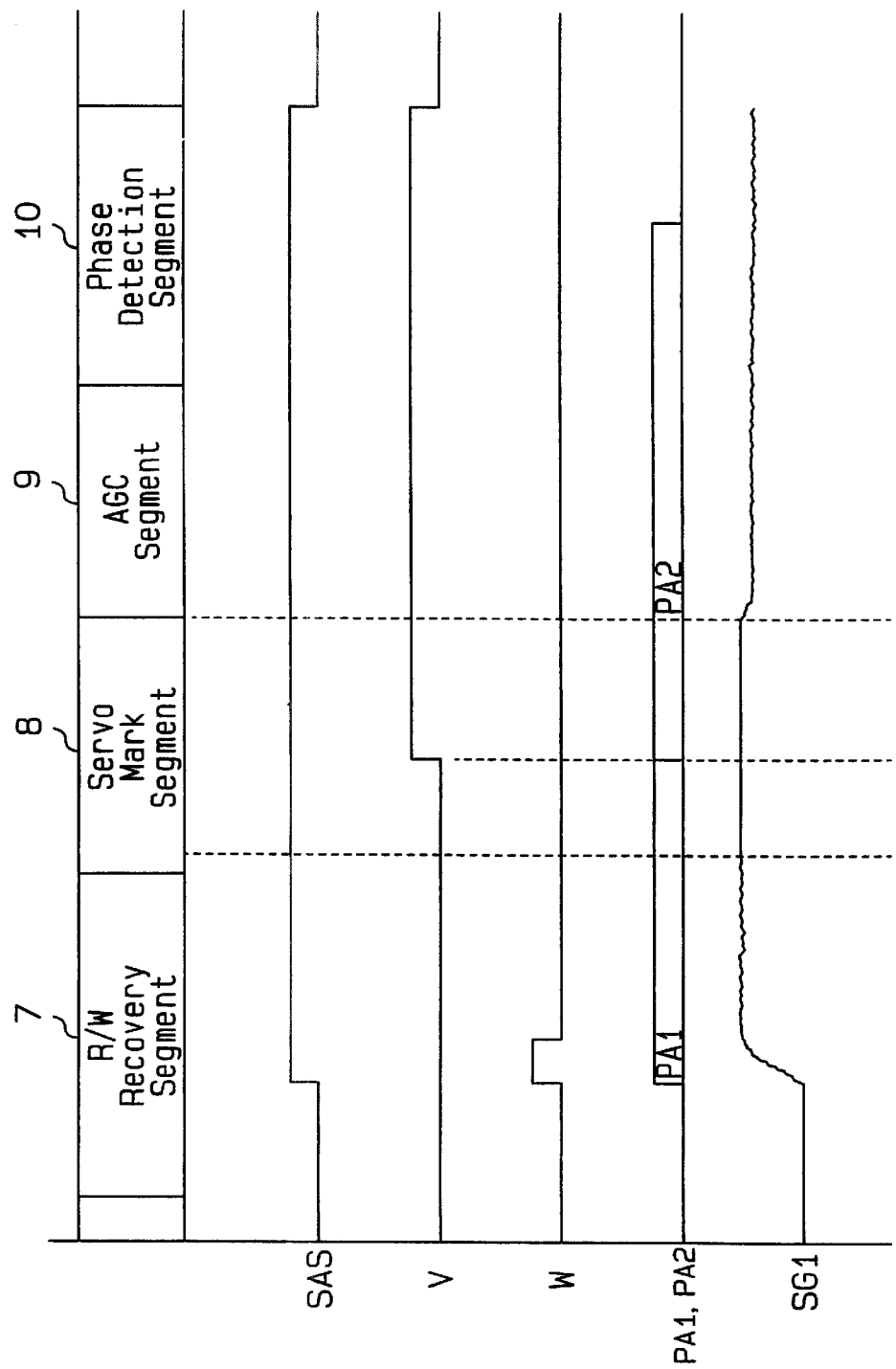
FIG. 12 is a combined timing and waveform chart illustrating the operation of the servo controller of FIG. 11.

The operation of the servo controller 102 will now be discussed. FIG. 12 is a combined timing and waveform chart illustrating the operation of the servo controller 102.

When the reading of the R/W recovery segment 7 is started, the servo mark detection signal V is low. Thus, the selector 21 selects the target value PA1 and provides the target value PA1 to the error calculator 12.

The AGC circuit controller 11A functions to vary the AGC voltage SG1 and converge the average value of the digital data signal SG4 to the target value PA1. Further, the filtered data signal SG3 is generated so that its amplitude is substantially equal to the full-scale range of the input level of the A/D converter 4.

Then, when the reading of the servo mark segment 8 is started, the error signal SG6 is fixed to a null value and the level of the AGC voltage SG1 becomes constant. Afterward, when the servo mark detection signal V goes high, the target value PA1 provided to the error calculator 12 is switched to the target value PA2.

When the reading of the AGC segment 9 is started with the target value set at PA2, the amplitude of the signal IN is changed. However, since the error signal SG6 is close to a null value, the change in the AGC voltage SG1 is small. After the reading of the AGC segment 9 is completed, the reading of the phase detection segment 10 is started. In this state, the amplitude of the filtered data SG3 is maintained substantially equal to the full-scale range of the input level of the A/D converter 4. The data stored in the phase detection segment 10 is accurately converted to the digital data signal SG4 by the A/D converter 4. The digital data signal SG4 is then provided to the servo processing circuit 5.

When the servo mark segment 8 is read, the error calculator 12 outputs the error signal SG6, which corresponds to the AGC segment 9, in a precedent manner.

The servo controller 102 of the second embodiment has the advantages described below.

(1) When reading the servo mark segment 8, the average target value of the digital data signal SG4 generated by the A/D converter 4 is switched from PA1 to PA2 in accordance with the ratio between the amplitude of the signal IN when the R/W recovery segment 7 is read and the amplitude of the signal IN when the AGC segment 9 is read. Thus, when starting the reading of the AGC segment 9, the average value of the digital data signal SG4 is approximated with the target value.

(2) When starting the reading of the AGC segment 9, the average value of the digital data signal SG4 is approximated with the target value PA2. Thus, the phase detection segment 10 is accurately read even if the size of the AGC segment 9 is reduced. Further, even if the AGC segment 9 is eliminated and the phase detection segment 10 is arranged adjacent to the servo mark segment 8, the phase detection data recorded in the phase detection segment 10 is read accurately.

[Third Embodiment]

Figure 13:
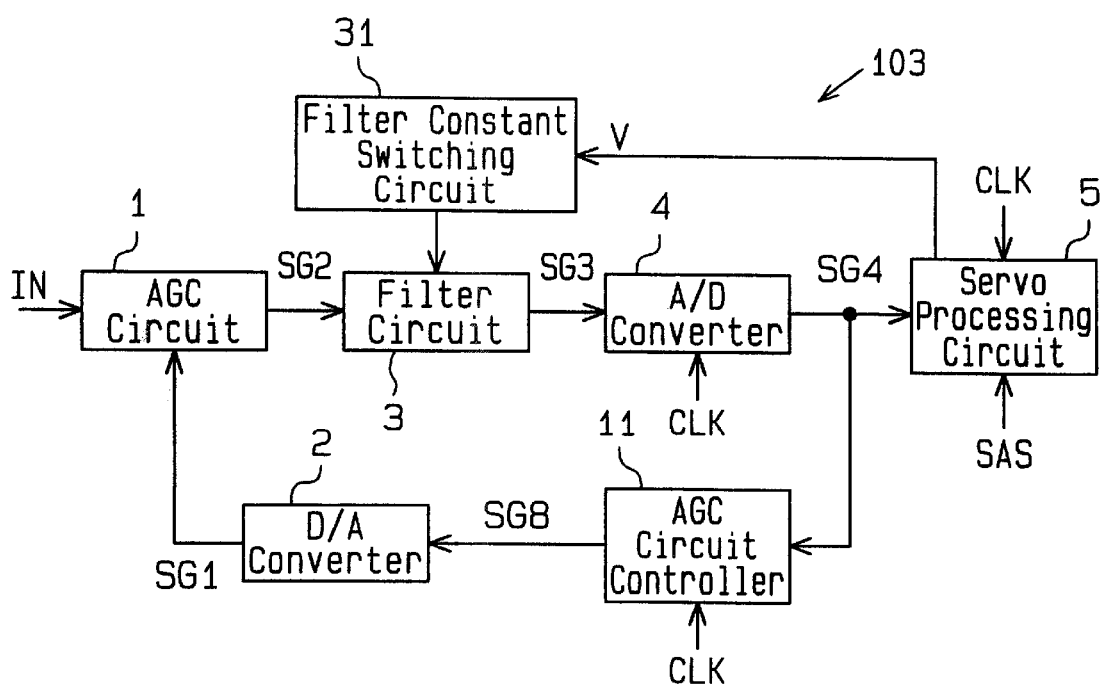
FIG. 13 is a schematic block diagram of a servo controller according to a third embodiment of the present invention.

FIG. 13 is a schematic block diagram of a servo controller 103 according to a third embodiment of the present invention. The servo controller 103 of the third embodiment is configured by adding a filter constant switching circuit 31 to the servo controller 101 of the first embodiment. The filter constant switching circuit 31 switches a cutoff frequency fc of the filter circuit 3 in accordance with the amplitude ratio when the servo mark segment 8 is read.

Therefore, when the R/W recover segment 7 and the AGC segment 9 are read, the filter circuit 3 outputs the filtered data signal SG3, so that its frequency is substantially equal to the full-scale range of the input level of the A/D converter 4. In the third embodiment, the cutoff frequency fc of the filter circuit 3 is switched to change the amplitude of the filtered data signal SG3.

Figure 14:
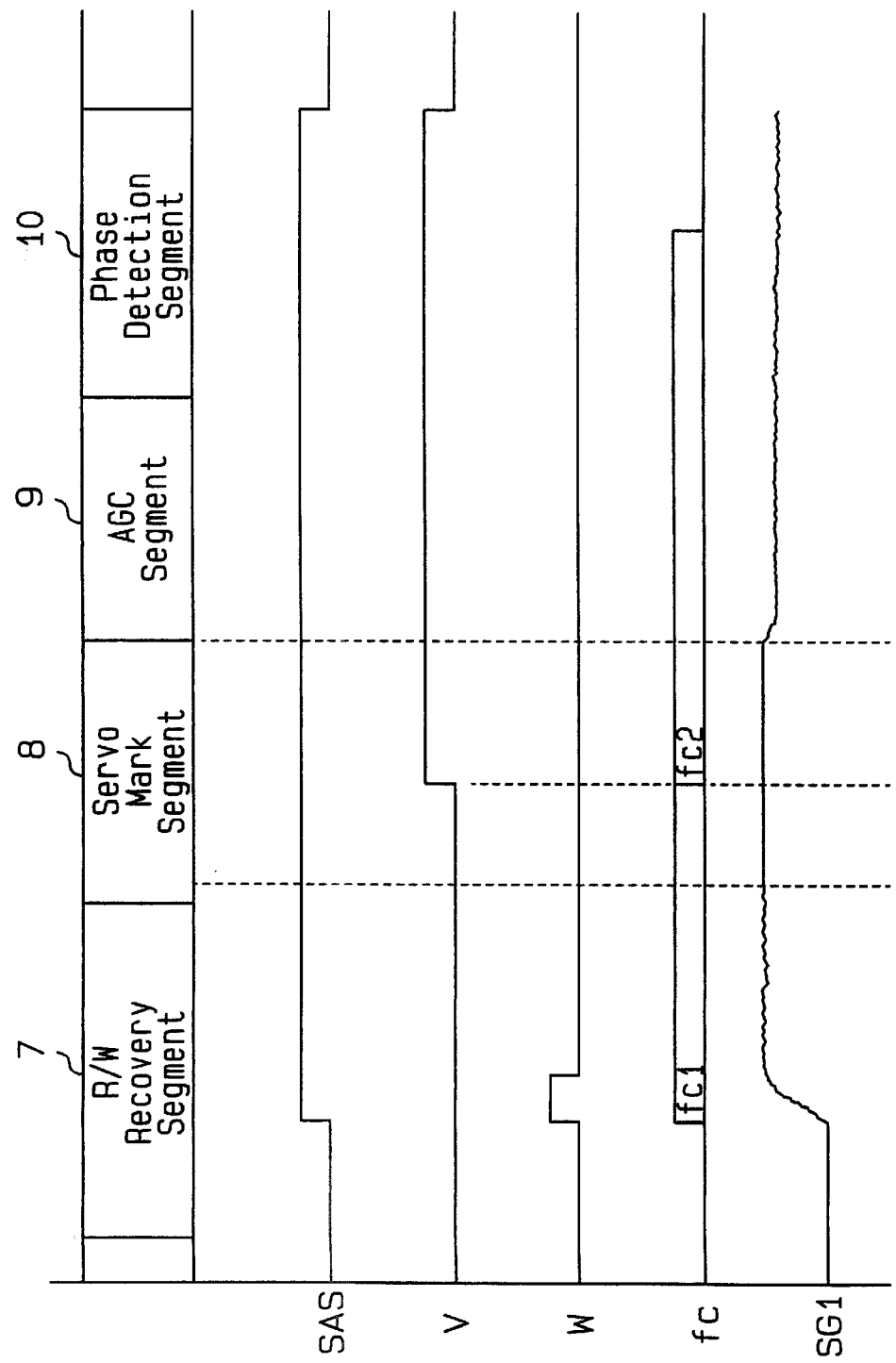
FIG. 14 is a combined timing and waveform chart illustrating the operation of the servo controller of FIG. 12.

FIG. 14 is a combined timing and waveform chart illustrating the operation of the servo controller 103.

Referring to FIG. 14, when the R/W recovery segment 7 is read, the filter constant switching circuit 31 sets the cutoff frequency fc to a first cutoff frequency fc1. This causes the amplitude of the filtered data signal SG3 to be substantially equal to the full-scale range of the input level of the A/D converter 4.

When the AGC segment 9 and the phase detection segment 10 are read, the filter constant switching circuit 31 sets the cutoff frequency fc to a second cutoff frequency fc2. This causes the amplitude of the filtered data signal SG3 to be substantially equal to the full-scale range of the input level of the A/D converter 4. The switching between the first cutoff frequency fc1 and the second cutoff frequency fc2 is performed in accordance with the servo mark detection signal V. Further, the switching between the first and second cutoff frequencies is easily performed by switching a circuit constant.

The filter constant switching circuit 31 may be incorporated in the filter circuit 3.

The servo controller 103 of the third embodiment has the advantages described below.

(1) When the servo mark segment 8 is read, the cutoff frequency of the filter circuit 3 may be switched beforehand in accordance with the ratio between the amplitude of the signal TN when the servo mark segment 8 is read and the amplitude of the signal IN when the AGC segment 9 is read. Thus, when the reading of the AGC segment 9 is started, the filtered data signal SG3 is generated so that its amplitude is equal to the full-scale range of the input level of the A/D converter 4.

(2) When the AGC segment 9 is read, the amplitude of the filtered data signal SG3 is substantially equal to the full-scale range of the input level of the A/D converter 4. Further, even if the AGC segment 9 is eliminated and the phase detection segment 10 is arranged adjacent to the servo mark segment 8, the phase detection data recorded in the phase detection segment 10 is read accurately.

[Fourth Embodiment]

Figure 15:
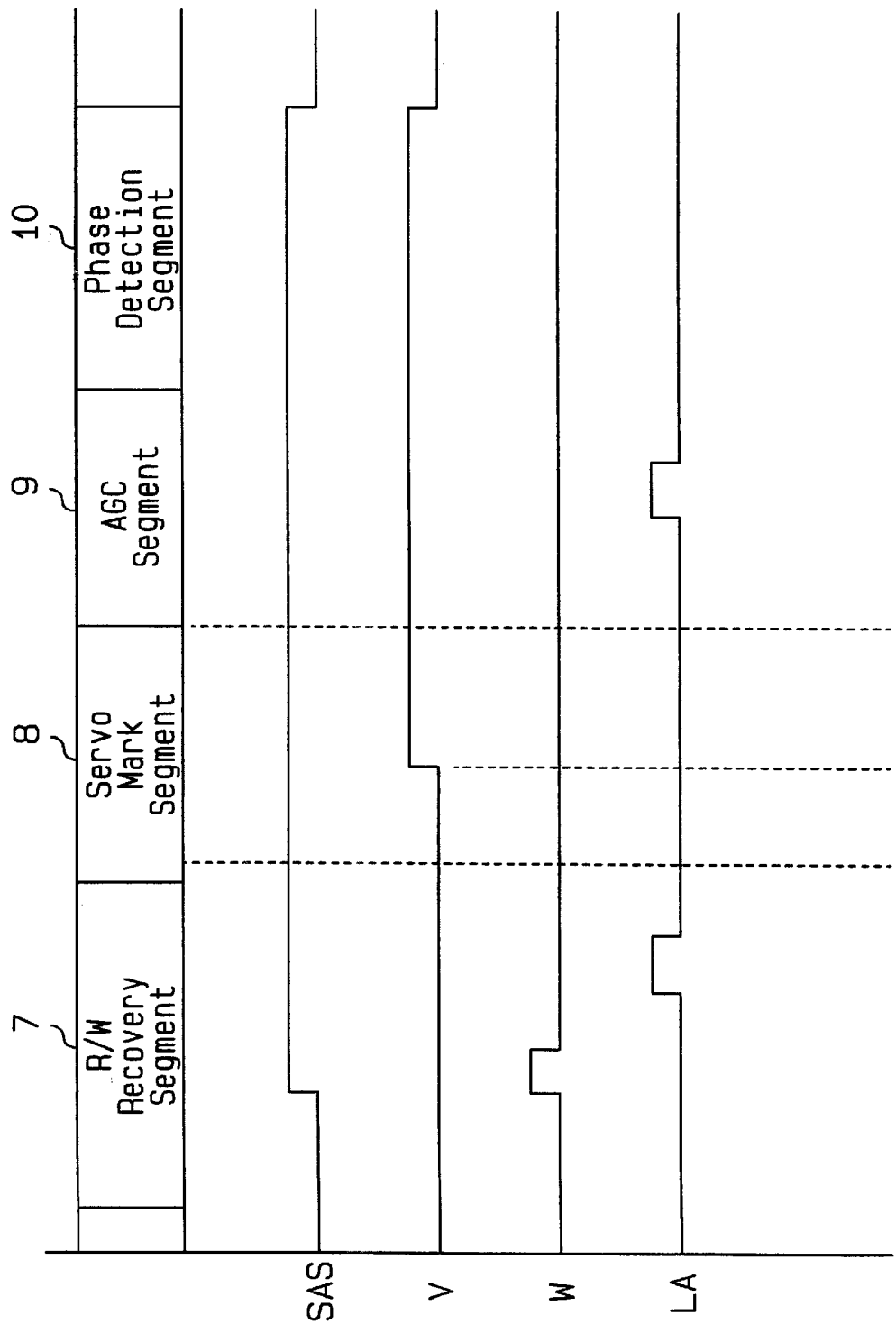
FIG. 15 is a schematic block diagram of a servo controller according to a fourth embodiment of the present invention.

FIG. 15 is a combined timing and waveform chart illustrating the operation of a servo controller according to a fourth embodiment of the present invention. In the servo controller of the fourth embodiment, the coefficient λ provided to the multiplying circuit 19 of the integrator 14 of the first embodiment takes the value of 1 when reading each segment 7, 8, 9, 10 of the servo section.

A latch signal LA goes high when the R/W recovery segment 7 and the AGC segment 9 are read at a timing in which the AGC voltage SG1 is converged to a constant level. In response to the latch signal LA, an external device (e.g., CPU) acquires and latches the AGC control signal SG8.

When the digital output signal SG4 of the A/D converter 4 is converged to the target value PA in each of the segments 7, 9, the AGC control signal SG8 is latched. In accordance with the latched data, for example, a firmware pre-stored in a CPU switches the target value output to the error calculator 12 in accordance with the latched data when the servo section is shifted. This allows the size of the servo section to be reduced.

[Fifth Embodiment]

Figure 16:
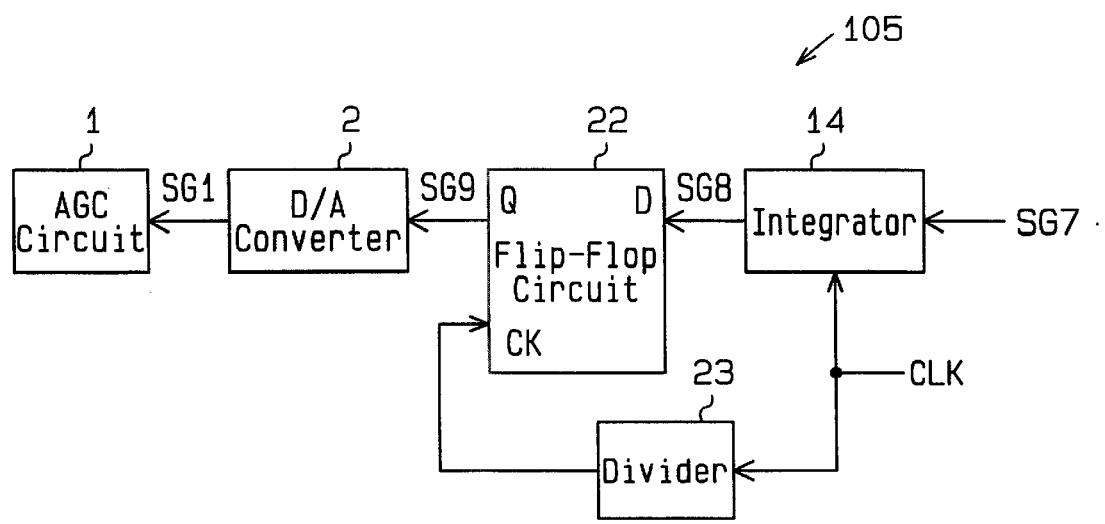
FIG. 16 is a schematic block diagram of a servo controller according to a fifth embodiment of the present invention.

FIG. 16 is a schematic block diagram of a servo controller 105 according to a fifth embodiment of the present invention. In the servo controller 105 of the fifth embodiment, if the operating speed of the D/A converter 2 is slower than that of the AGC circuit controller 11, the frequency of the AGC control signal SG8 is adapted to the operating frequency of the D/A converter 2.

With reference to FIG. 16, the integrator 14 of the AGC circuit controller 11 provides the AGC signal SG8 to a flip-flop circuit 22. A frequency divider 23 divides frequency of the clock signal CLK, which is provided to the integrator 14. The frequency may be divided, for example, by two to generate a clock signal CK, which is provided to the flip-flop circuit 22.

Figure 17:
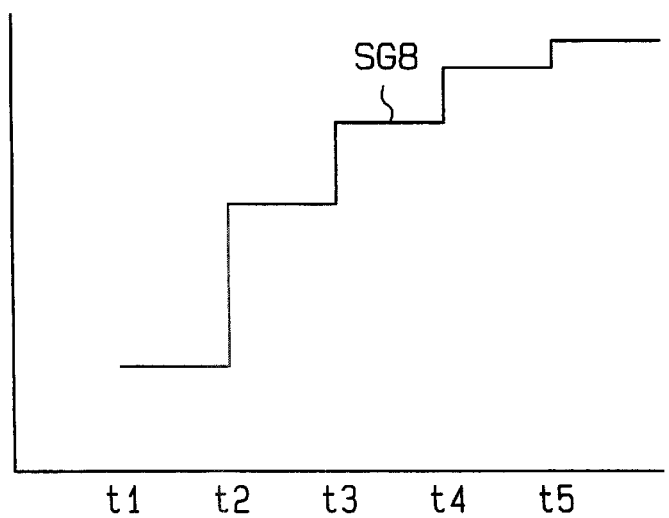
FIG. 17 is a waveform chart illustrating the operation of the servo controller of FIG. 16.
Figure 18:
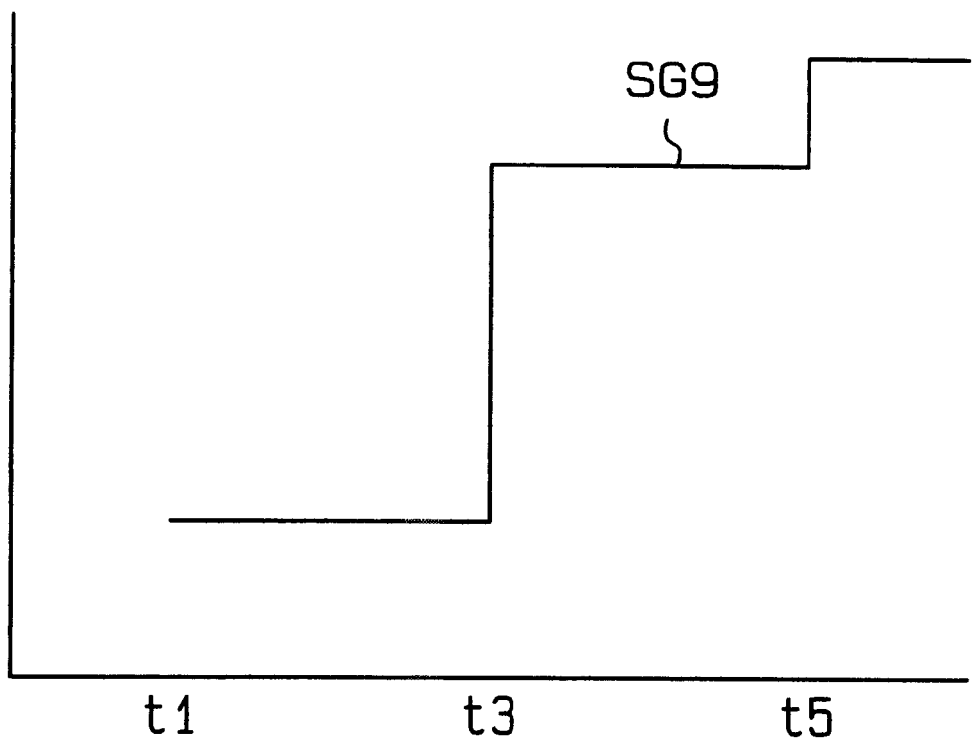
FIG. 18 is a waveform chart illustrating the operation of the servo controller of FIG. 16.

Whenever the flip-flop circuit 22 receives the clock signal CK, the flip-flop circuit 22 acquires the AGC signal SG8 and provides the D/A converter 2 with a divisional AGC signal SG9. In accordance with the AGC control signal SG8, which is illustrated in FIG. 17, the flip-flop circuit 22 generates the divisional AGC signal SG9, which is illustrated in FIG. 18. The D/A converter 2 converts the divisional AGC signal SG9 to the AGC voltage SG1, which is an analog signal, and supplies the AGC circuit 1 with the AGC voltage SG1.

In the servo controller 105 of the fifth embodiment, the flip-flop circuit 22 converts the AGC signal SG8 to the divisional AGC signal SG9, whose frequency is one half of that of the AGC signal SG8. Thus, even if the operating speed of the D/A converter 2 is slower than that of the AGC circuit controller 11 (see FIG. 13), the AGC circuit 1 is provided with the desirable AGC voltage SG1.

[Sixth Embodiment]

Figure 19:
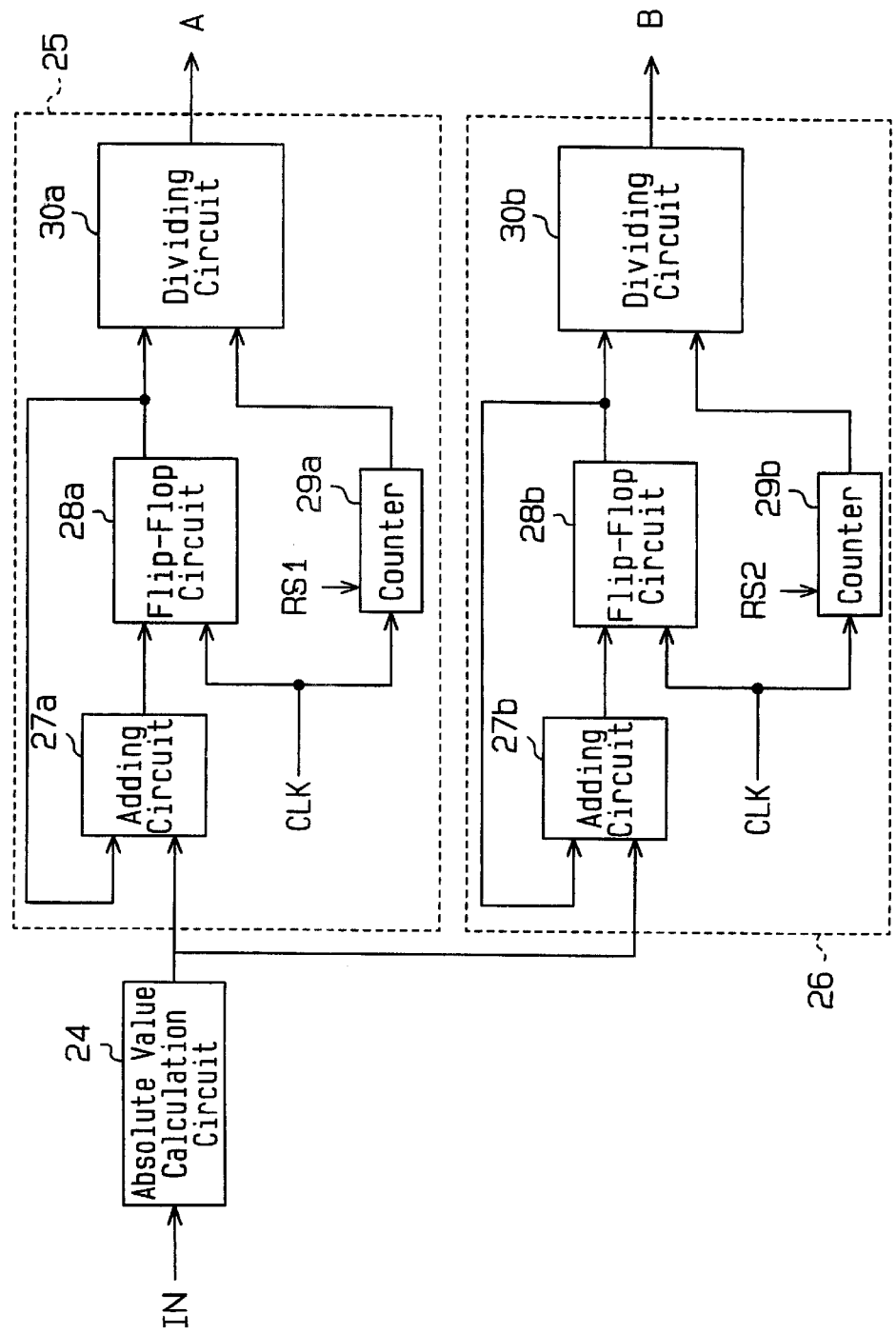
FIG. 19 is a schematic block diagram of an average value calculation circuit of a servo controller according to a sixth embodiment of the present invention.

FIG. 19 is a schematic block diagram partially illustrating a servo controller according to a)sixth embodiment of the present invention. FIG. 19 illustrates a coefficient calculation circuit for calculating the coefficient N that is provided to the selector 20 of the integrator 14 of FIG. 9.

The input signal IN is provided to an absolute value calculation circuit 24. The absolute value calculation circuit 24 calculates an absolute value of the amplitude of the input signal IN and provides the absolute value to first and second average calculation circuits 25, 26.

The first average value calculation circuit 25 calculates an average value of the signal IN read from the R/W recover segment 7. Further, the first average value calculation circuit 25 includes an adding circuit 27a, a flip-flop circuit 28a, a counter 29a, and a dividing circuit 30a.

The adding circuit 27a receives the input signal IN and provides an added signal to the flip-flop circuit 28a. The flip-flop circuit 28a latches the added signal of the adding circuit 27a in accordance with the provided clock signal CLK.

The latch signal of the flip-flop circuit 28a is provided to the dividing circuit 30a and the adding circuit 27a. Thus, the adding circuit 27a and the flip-flop circuit 28a perform integration in the same manner as the adding circuit 17 and the flip-flop circuit 18 of FIG. 9.

Figure 20:
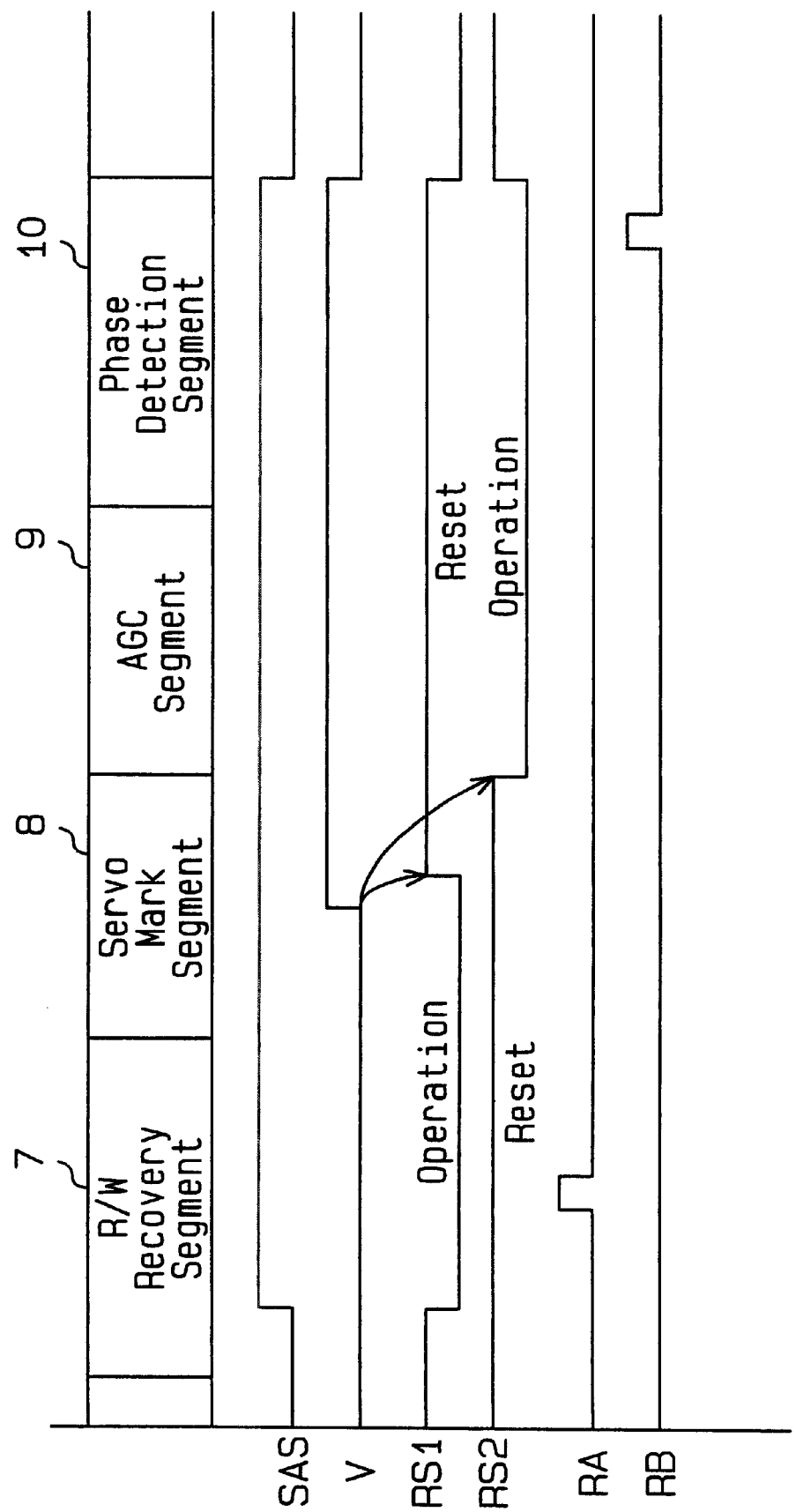
FIG. 20 is a combined timing and waveform chart illustrating the operation of the servo controller of FIG. 19.

The clock signal CLK is provided to the counter 29a. The counter 29a counts the clock signal CLK and provides the count value to the dividing circuit 30a. The counter 29a also receives a reset signal RS1. Referring to FIG. 20, the reset signal RS1 goes high, when the servo mark detection signal V goes high and goes low when the reading of the phase detection segment 10 is completed.

The dividing circuit 30a divides the integrated value from the flip-flop circuit 28a with the count value of the counter 29a, so to calculate an average value A of the input signal IN.

In this manner, the first average value calculation circuit 25 calculates the average value A of the amplitude of the signal IN read from the R/W recovery segment 7.

The second average value calculation circuit 26 differs from the first average value calculation circuit 25 only in that the counter 29b is provided with a reset signal RS2. As shown in FIG. 20, the reset signal RS2 is provided when the reading of the phase detection segment 10 is completed. The reset signal RS2 is released after a predetermined time elapses from when the servo mark detection signal V goes high.

The second average value calculation circuit 26 calculates an average value B of the amplitude of the IN signal read from the AGC segment 9 and the phase comparison segment 10.

With reference to FIG. 20, in response to a first recording signal RA, the average value A calculated by the first average value calculation circuit 25 is stored in a register. In response to a second recording signal RB, the average value B calculated by the second average value calculation circuit 26 is stored in the register. The length (sampling number) of each read segment is predetermined. The first and second recording signals RA, RB are thus generated by counting the sampling number with a counter.

The amplitude ratio between the R/W recovery segment 7 and the phase detection segment 10 is calculated from the average values A, B. The amplitude ratio is stored in, for example, a predetermined register as the coefficient N provided to the selector 20 of FIG. 9. If both of the reset signals RS1 and RS2 do not go high, the functions of the first and second average calculation circuits 25, 26 of FIG. 19 may be integrated into a single average calculation circuit.

[Seventh Embodiment]

Figure 21:
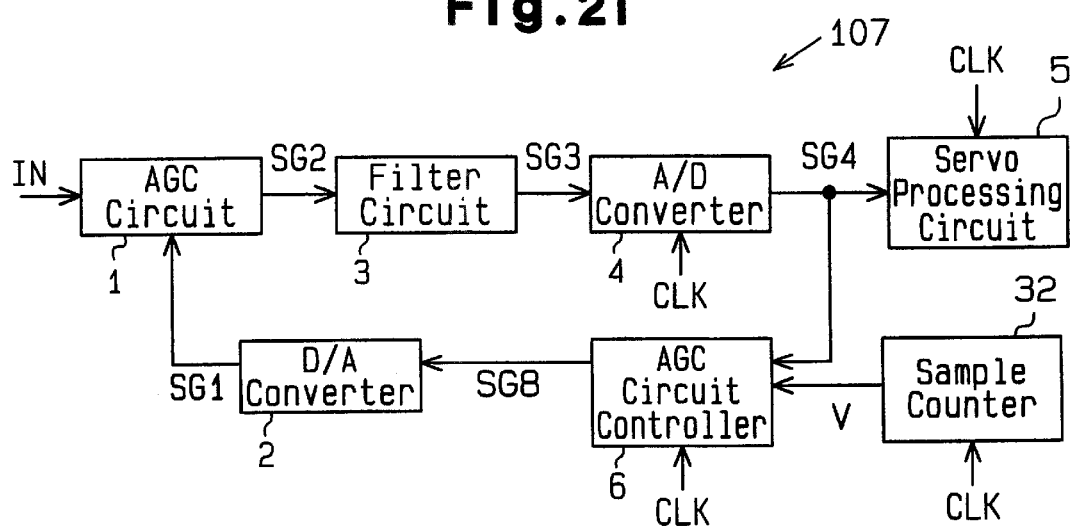
FIG. 21 is a schematic block diagram of a servo controller according to a seventh embodiment of the present invention.

FIG. 21 is a schematic block diagram of a servo controller according to a seventh embodiment of the present invention. The servo controller 107 of the seventh embodiment is configured by adding a sample counter 32 to the servo controller 101 of the first embodiment. The sample counter 32 generates the servo mark detection signal V.

The servo mark segment 8 has a predetermined length (number of samples) and normally includes 30 to 40 samples. When reading the servo mark segment 8, the samples of the servo mark section 8 is counted by the sample counter 32. When the counted samples reache a predetermined number, the sample counter 32 provides the AGC circuit controller 11 with the servo mark detection signal V.

The output timing of the servo mark detection signal V does not require accuracy. Thus, the frequency of a normal sampling clock may be divided by n (e.g., eight) to generate the clock signal CLK, which operates the sample counter 32. In this case, a counter having a slow operating speed may be used. Further, the bit number of the counter is decreased. This decreases the circuit area.

The servo mark detection signal V generated by the sample counter 32 may be used in any one of the servo controllers of the second to sixth embodiments.

[Eighth Embodiment]

Figure 22:
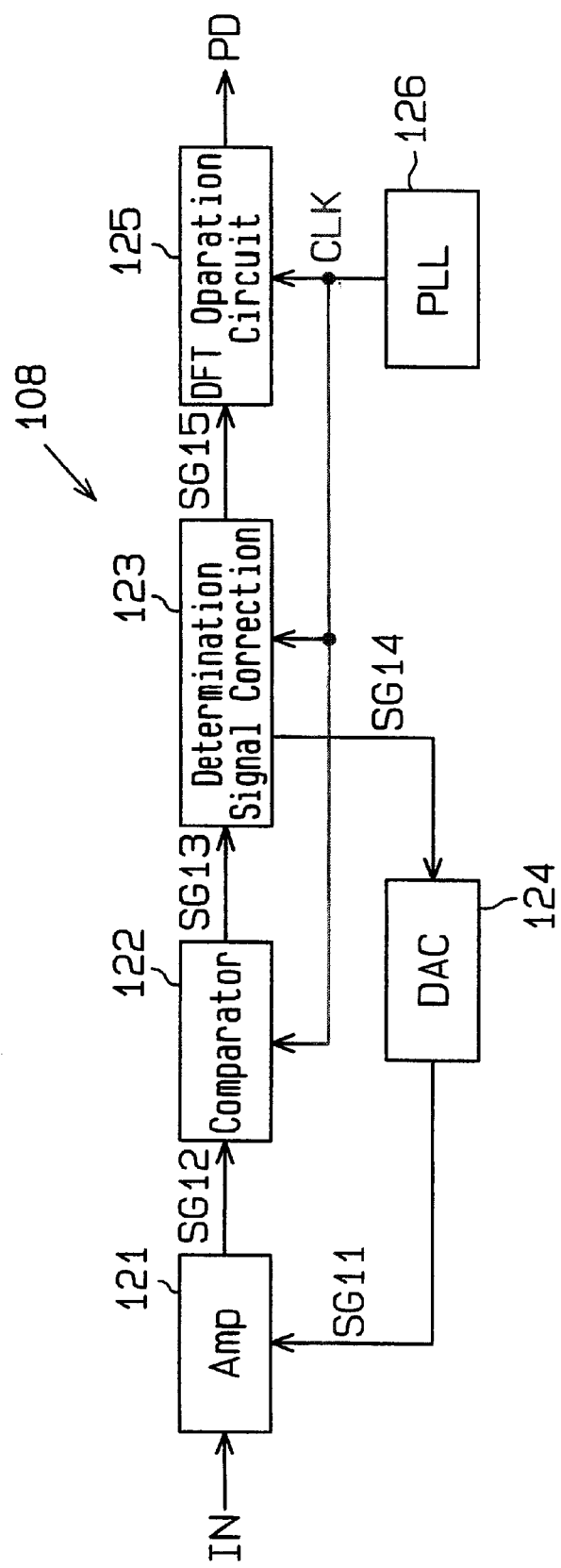
FIG. 22 is a schematic block diagram of a phase calculator according to an eighth embodiment of the present invention.

FIG. 22 is a schematic block diagram of a phase calculator 108 according to an eighth embodiment of the present invention. The phase calculator 108 is used to servo control the read position of a read head.

The phase calculator 108 includes an amplifier 121, a comparator 122, a determination signal correction circuit 123, a D/A converter 124, a discrete Fourier transform (DFT) operational circuit 125, and a PLL circuit 126. The DFT operational circuit 125 is included in the servo processing circuit 5 of FIG. 6.

The amplifier 121 receives an input signal IN read from a recording medium and is supplied with a correction voltage SG11 from the D/A converter (DAC) 124. The amplifier 121 is a high gain amplifier that has a relatively high gain and amplifies the input signal IN. The amplifier 121 adds the correction voltage SG11 to the amplified signal and generates an amplified input signal SG12, which is provided to the comparator 122.

The comparator 122 has a determination range defined by a first threshold value TH1, which is a high potential, and a second threshold value TH2, which is lower than the first threshold value TH1. The comparator 122 samples the amplified input signal SG12 in correspondence with the clock signal CLK. The comparator 122 compares the sampled level with the first and second threshold values (TH1, TH2) and generates a determination signal SG13, which is provided to the determination signal correction circuit 123. The determination signal SG13 includes a digital data string of multiple values (three values in the eighth embodiment).

The comparator 122 generates the determination signal SG13 having a value of 1, when the level of the amplified input signal SG12 is greater than or equal to the first threshold value TH1. The comparator 122 generates the determination signal SG13 having a value of 0 when the level of the amplified input signal SG12 is between the first threshold value TH1 and the second threshold value TH2. Further, the comparator 122 generates the determination signal SG13 having the value of −1 when the level of the amplified input signal SG12 is less than or equal to the first threshold value TH1.

Figure 25:
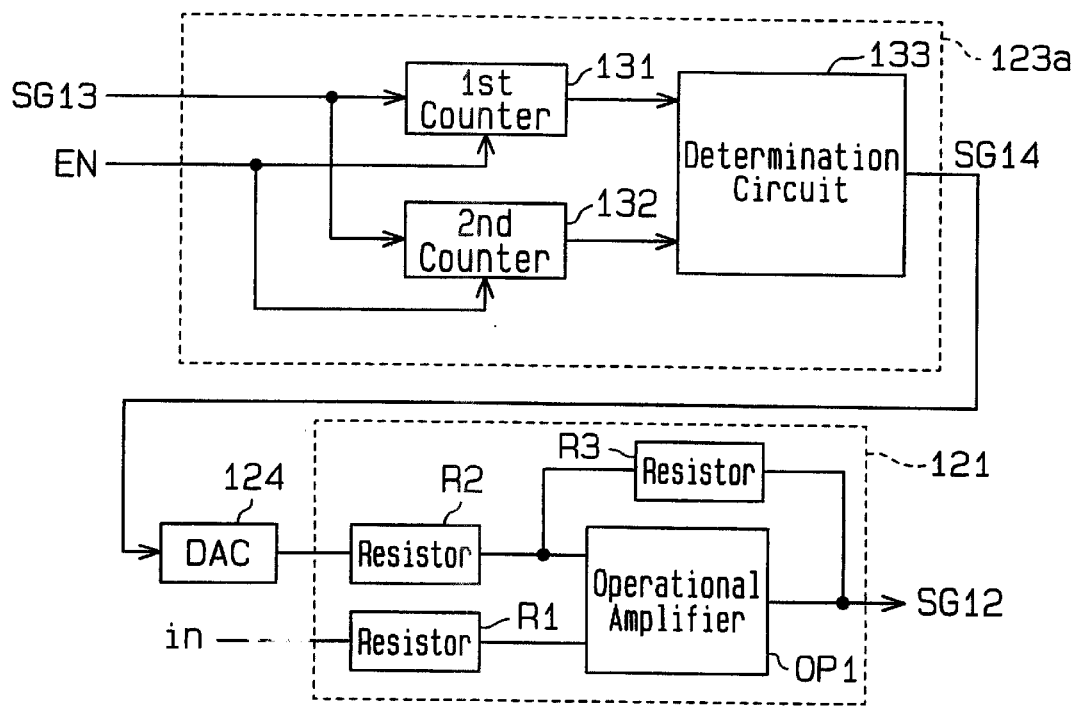
FIG. 25 is a schematic block diagram of the amplifier and median value correction circuit of the phase calculator of FIG. 22.
Figure 26:
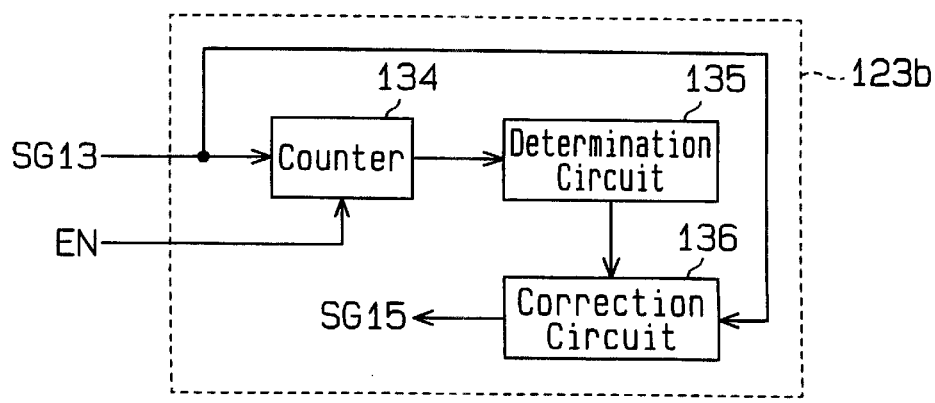
FIG. 26 is a schematic block diagram of a data string correction circuit of the phase calculator of FIG. 22.

The determination signal correction circuit 123 includes a median value correction circuit 123a (FIG. 25) and a data string correction circuit 123b (FIG. 26). The median value correction circuit 123a maintains the symmetry of the data string. When the determination signal SG13 is asymmetric, the median value correction circuit 123a generates a median value correction signal SG14 to correct the asymmetric state, and provides the correction signal SG14 to D/A converter 124.

The D/A converter '124 D/A converts the median value correction signal SG14 to generate the correction voltage SG11 and supply the amplifier 121 with the correction voltage SG11. The correction voltage SG11 compensates for the offset voltage of the amplified input signal SG12. As a result, the median value of the amplified input signal SG12 substantially matches the median value of the first and second threshold values TH1, TH2 of the comparator.

Figure 2:
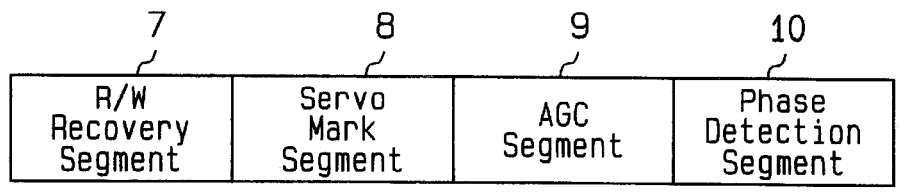
FIG. 2 is a diagram illustrating a servo section of a recording medium.

The change in the median value of the amplified input signal SG12 is significantly slower than the change in the frequency of the signal SG12. Accordingly, the D/A converter 124 does not have to be operated at a high speed. In comparison to a D/A converter that operates at a high speed, a D/A converter that operates at a low speed has a simplified configuration and consumes less current. The data string correction circuit 123b corrects errors of the determination signal sG13 that are produced by noise and waveform distortion. The data string of the determination signal SG13 when the phase detection segment 10 (FIG. 2) is read has a repetitive pattern that corresponds with the fundamental wave cycle of the input signal IN. The data string of the determination signal SG13 includes consecutive codes "1", which continue for a predetermined number of times, and consecutive codes "−1", which continue for the same number of times as codes "1".

The data string correction circuit 123b monitors the number of the consecutive codes "1" and "−1". When the consecutive numbers of the two codes do not match, the data string correction circuit 123b corrects the data string so that the consecutive numbers match. The data string correction circuit 123b generates a phase calculation signal SG15 from the corrected data string and provides the phase calculation signal SG15 to the DFT operational circuit 125.

The data string of the determination signal SG13 may, or may not, include a code "0". In each case, a corresponding reference data string used for the correction is preset. If the determination signal SG13 does not include code "0", a first reference data string D1 is set. If the determination signal SG13 includes code "0", a second reference data string D2 is set.

When the data string does not require correction, the data string correction circuit 123b provides the DFT operational circuit 125 with the phase calculation signal SG15, which has the same data string as the determination signal SG13. When the data string requires correction, the correction circuit 123b provides the DFT operational circuit 125 with the phase calculation signal SG15, which has the corrected data string.

The DFT operational circuit 125 performs a discrete Fourier transform on the phase calculation signal SG15 to obtain phase data. The DFT operational circuit 125 obtains phase difference data PD from the phase data and outputs the phase difference data PD. More specifically, the DFT operational circuit 125 includes a register (not shown), which stores the phase data. The DFT operational circuit 125 uses the stored phase data to calculate the phase difference between the phases of a reference waveform and a plurality of waveforms, so to generate the phase difference data PD from the phase difference of the plurality of waveforms. The phase difference data PD is used to servo control the read head position, the rotating speed of the recording medium, and the like.

Figure 23:
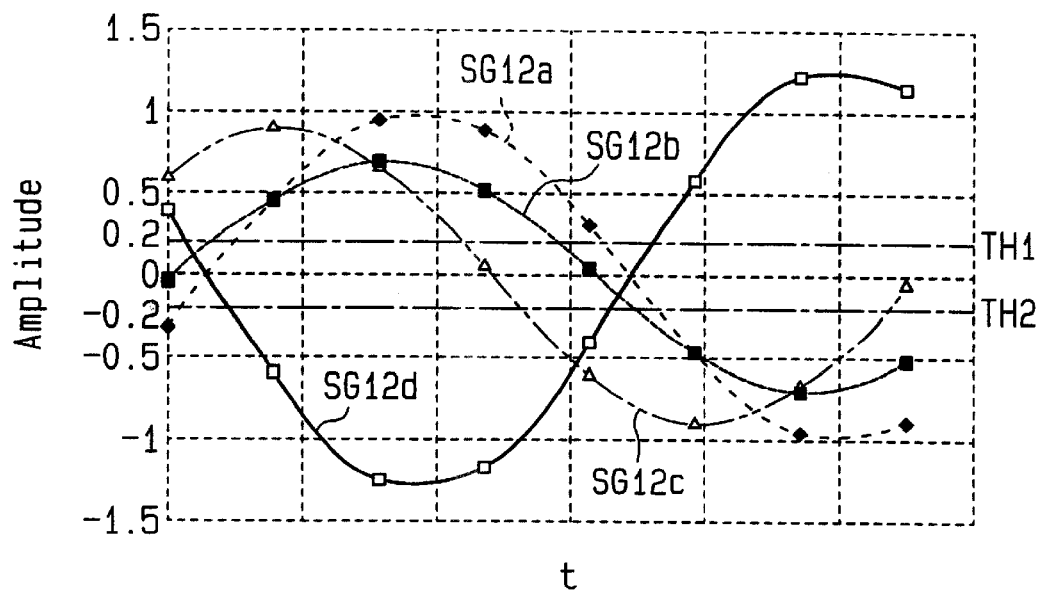
FIG. 23 is a chart illustrating the waveform of the output signal of an amplifier of the phase calculator of FIG. 22.
Figure 24:
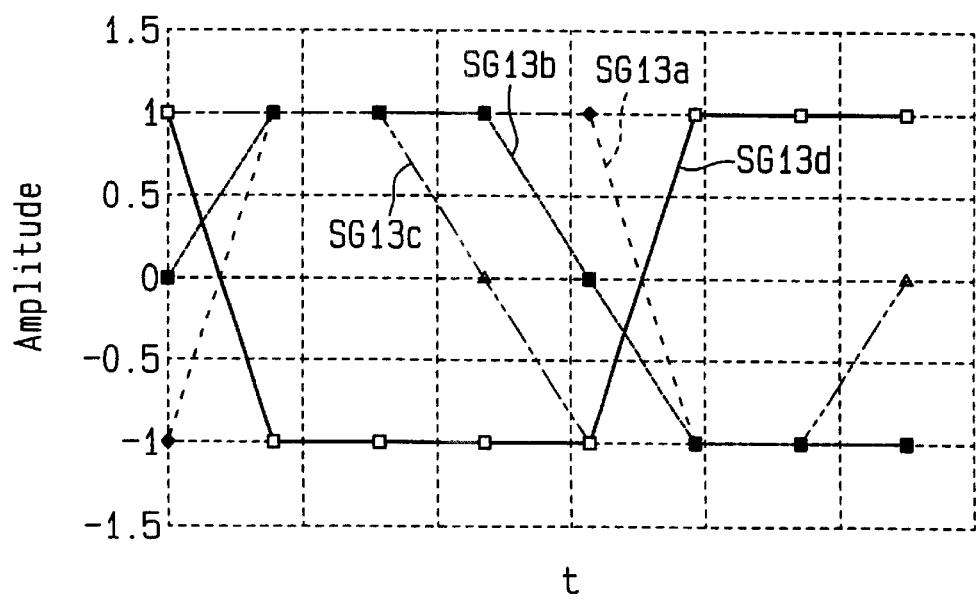
FIG. 24 is a chart illustrating the waveform of a signal output from a comparator of the phase calculator of FIG. 22.

FIG. 23 is a waveform diagram illustrating the relationship between the amplified input signal SG12 and the threshold values TH1, TH2 of the comparator 122. FIG. 24 is a waveform diagram of the determination signal SG13. The sampling points are the same in FIGS. 23 and 24.

FIG. 23 illustrates a plurality of (four) amplified input signals SG12a, SG12b, SG12c, SG12d having the same frequency. The amplified input signals SG12a–SG12d are each read from the plurality of phase detection sections 10 on the recording medium. The amplified input signals SG12a–SG12d have the same frequency to facilitate illustration.

The phase detection segment 10 has four fields. In each field, a signal pattern is recorded at every predetermined clock pitch, which is determined by the reference clock. The phase of the signal pattern is shifted in accordance with the track position. The amplifier 121 generates the amplified input signals SG12a, SG12b, SG12c, SG12d in accordance with the signal patterns.

The amplitudes of the amplified input signal SG12a–SG12d are significantly greater than the input full-scale range of the comparator 122 and range, for example, between −0.2 and 0.2. In this embodiment, as shown in FIG. 23, the first threshold value TH1 of the comparator 122 is 0.2 and the second threshold value TH2 is −0.2.

The comparator 122 compares the sampling levels of the signals SG12a–SG12d with the first and second threshold values TH1, TH2. With reference to FIG. 24, the comparator 122 generates determination signals SG13a, SG13b, SG13c, SG13d, each of which is formed from a data string having three values (1, 0, −1) in accordance with the comparison result. The determination signals SG13a–SG13d are provided to the determination signal correction circuit 123.

The phase difference between the determination signals SG13a–SG13d and the fundamental wave is substantially equal to the phase difference between the amplified input signals SG12a–SG12d. Accordingly, the phase calculator 108 calculates the phase differences between the determination signals SG13a–SG13d to obtain the same result as when the phase differences between the analog signals SG12a–SG12d are calculated.

Each datum of the determination signals SG13a–SG13d is represented by a two-bit digital value. Therefore, the determination signal correction circuit 123 and the DFT operational circuit 125 have a relatively small circuit area, and the current consumption of the circuits 123, 125 is reduced.

The structure and configuration of the determination signal correction circuit 123 will now be discussed.

Referring to FIG. 25, the amplifier 121 includes resistors R1, R2, R3 and an operational amplifier OP1. The operational amplifier OP1 is provided with the input signal in via the first resistor R1 and the correction voltage SG14 via the second resistor R2. The amplified input signal SG12 is fed back to the input terminal of the operational amplifier OP1 via the third resistor R3.

The median value correction circuit 123a includes first and second counters 131, 132 and a determination circuit 133. The first and second counters 131, 132 are each provided with the determination signal SG13 and the enable signal EN. The enable signal EN designates the count period of the first and second counters 131, 132 and is provided from a control circuit (not shown). The first and second counters 131, 132 function over a period that is an integer multiple of the data string cycle of the determination signal SG13.

The first counter 131 counts the data value "1" of the determination signal SG13 and the second counter 132 counts the data value "−1". Each of the first and second counters 131, 132 provides its count value to the determination circuit 133 when the predetermined count period elapses.

The determination circuit 133 compares the count values of the first and second counters 131, 132. When the count value of the first counter 131 is greater than that of the second counter 132, for example, the value of the correction signal SG14 is increased in accordance with the difference between the count values. Contrarily, if the count value of the first counter, 131 is lower than that of the second counter 132, the determination circuit 133 decreases the value of the correction signal SG14 in accordance with the difference between the count values. The correction decreases the level of the correction voltage SG11. The offset voltage varies in accordance with the change in the correction voltage SG11 and corrects the median value of the amplified input signal SG12.

Figures 27, 28:
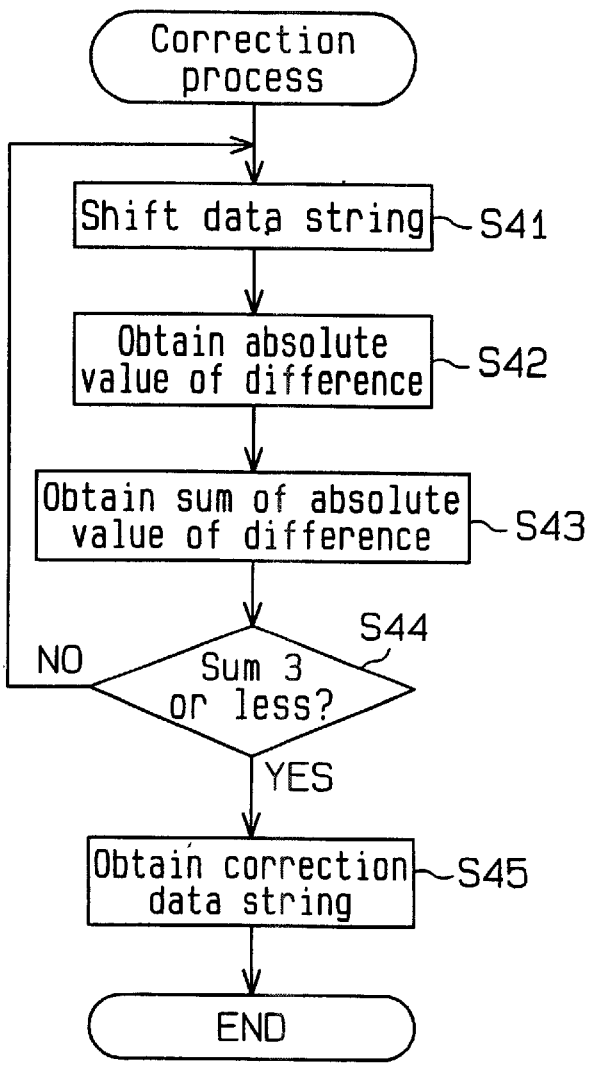
FIG. 27 is a chart used to illustrate media value correction.
FIG. 28 is a flowchart illustrating data correction.

When the determination signal SG13 is generated by sampling the amplified input signal SG12 eight times per cycle, with reference to FIG. 27, a first reference data string D1 which does not include data value "0", or a second reference data string D2 which includes data value "0", is generated. If the median value of the amplified input signal SG12 is offset, a data string D3 or D4 of the determination signal SG13 is generated. The data string D3 does not include data value "0" and the consecutive number of data value "1" is less than that of the data value "−1". The data string D4 includes data value "0", and the consecutive number of data value "1" is less than that of data value "−1".

In this manner, the consecutive numbers of data values "1" and "−1" are counted and compared to determine whether the generated data string of the determination signal SG13 is proper. The offset amount of the amplifier 121 is adjusted in accordance with the difference between the consecutive number of data value "1" and that of data value "−1" to adjust the offset amount of the amplifier 121. This corrects the median value of the amplified input signal SG12. As a result, the determination signal SG13, which has first and second reference data strings D1, D2, is obtained.

With reference to FIG. 26, the data string correction circuit 123b includes a counter 134, the determination circuit 135, and the correction circuit 136.

The counter 134 is provided with the determination signal SG13 and the enable signal EN. The enable signal EN designates the count period of the counter 134 and is provided from a control circuit (not shown). The count period is an integer multiple of the cycle of the determination signal SG13. The counter 134 counts the data value "0" of the determination signal SG13 during a predetermined count period and provides the count value to the determination circuit 135.

The determination circuit 135 pre-stores a determination value M. The determination circuit 135 compares the determination value M with the count value of the counter 134 and determines whether the data string includes a predetermined number of the data value "0". The determination circuit 135 provides the correction circuit 136 with the determination result.

The correction circuit 136 stores the first and second reference data strings D1, D2 of FIG. 27. The data strings D1, D2 include the necessary number of bits for correcting the data string of the determination signal SG13. For example, when correcting two cycles (16 bits) of data strings D1, p2 where eight samples are obtained per cycle, the first and second reference data strings D1, D2 of three cycles (24 bits) are stored. The correction circuit 136 corrects the data string of the determination signal with the first and second reference data strings D1, D2.

The correction circuit 136 performs correction using the first reference data string D1 when the data string of the determination signal SG13 does not include value "0" and the second reference data string D2 includes value "0". The correction circuit 136 generates the phase calculation signal SG15, which includes the corrected data string, and provides the phase calculation signal SG15 to the DFT operational circuit 125.

FIG. 28 is a flowchart illustrating a data string correction process performed by the correction circuit 136.

At step S41, the correction circuit 136 shifts a correction subject data string DA by one bit. Then, at step S42, the correction circuit 136 compares the bits of the correction subject data string DA with the first or second reference data string (D1 or D2) to obtain the absolute value of difference of each bit. Subsequently, at step S43, the correction circuit 136 obtains the sum of the absolute values.

At step S44, the correction circuit 136 determines whether the sum is equal to, or greater than a predetermined value. The predetermined value is set to determine how close the bit string of the correction subject data string DA is to the bit string of the first or second reference data string (D1 or D2). In the eighth embodiment, the predetermined value is set at, for example, "3". A smaller sum indicates that the correction subject data string DA is closer to the first or second reference data string (D1 or D2).

Accordingly, when the sum is greater than a predetermined value, the correction circuit 136 determines that the data string DA is not similar to the first or second reference data string (D1 or D2). In this case, the correction circuit 136 returns to step S41 and shifts the data string DA for another bit.

If the sum is equal to, or less than a predetermined value at step S44, the correction circuit 136 uses the data bits of the first or second reference corresponding to the present data string DA to generate the phase calculation signal SG15.

In this manner, the correction circuit 136 obtains the absolute value of the sum of the differences between the bits of the correction subject data string DA and the bits of the first or second reference data string (D1 or D2) while shifting the correction subject data string DA. If the sum is less than or equal to the predetermined value, he correction circuit 136 uses the first or second reference data string (D1 or D2) to generate the phase calculation signal SG15.

The operation of the correction circuit 136 will now be discussed.

FIG. 29(a) shows an example of a data string DA1. The data string DA1 includes three zeros. Thus, the correction circuit 136 uses the data string D2a of FIG. 29(b), which corresponds to the second reference data string D2, as the reference data string.

With reference to FIG. 29(c), the correction circuit 136 first associates the correction order number of the reference data string D2a with the sample number of the correction data string DA1. Then, the correction circuit 136 obtains the absolute value of the difference between each set of associated data. Subsequently, the correction circuit 136 obtains the sum of the absolute values. In this case, the sum is 15, which is greater than the predetermined value of 3. The correction circuit 136 then shifts the data string DA1 to the right by one bit as shown in FIG. 29(d). The resulting sum becomes 23, which is greater than the predetermined value of 3. Consequently, the correction circuit 136 further shifts the data string DA1 to the right.

FIG. 30(a) shows the data string DA1 shifted to the right by two bits from its original position. In this case, the sum is 25. FIG. 30(b) shows the data string DA1 shifted to the right by three bits from its original position. In this case, the sum is 25. FIG. 30(c) shows the data string DA1 shifted to the right by four bits from its original position. In this case, the sum is 17. All of these sums are greater than the predetermined value of 3.

FIG. 31(a) shows the data string DA1 shifted to the right by five bits from its original position. In this case, the sum is 9. FIG. 31(b) shows the data string DA1 shifted to the right by six bits from its original position. In this case, the sum is 1, which is less than the predetermined value of 3, and the data string DA1 resembles to the reference data string D2a.

Accordingly, referring to FIG. 31(c), the correction circuit 136 associates the data bits of the data string DA1, which is shifted to the right by six bits, with the data bits of the reference data string D2a and generates a corrected data string DA2 from the reference data string D2a.

The data string DA2 generated in this manner is the phase calculation signal SG15. The correction circuit 136 provides the DFT operational circuit 125 with the phase calculation signal SG15.

The operation of the phase calculator 108 will now be described.

Figures 34, 35:
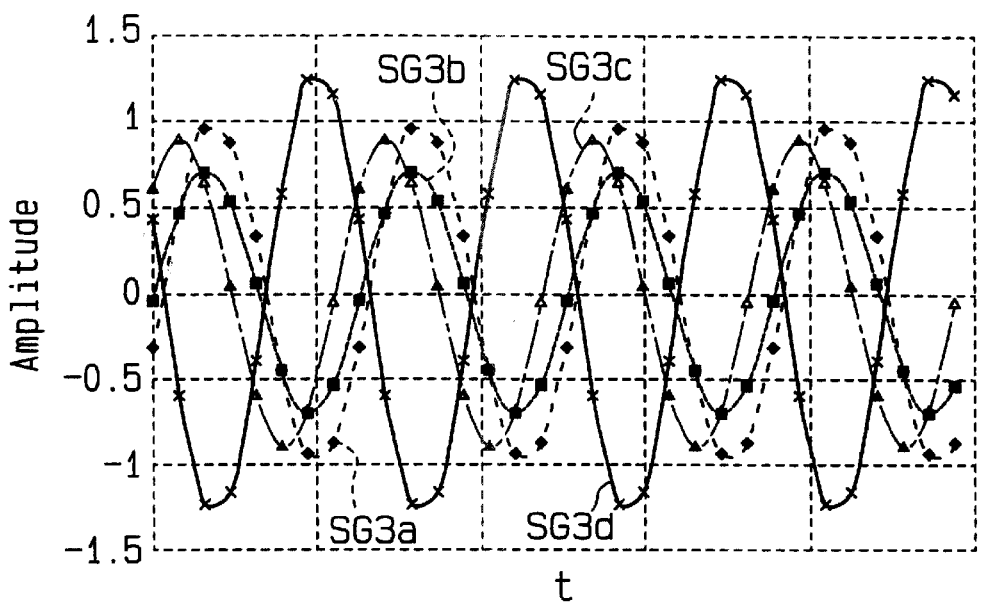
FIG. 34 is a waveform chart showing the sampling result of the input signal of FIG. 32.
FIG. 35 is a table illustrating the output of the comparator.

FIGS. 32 to 34 describe a conventional method for performing phase calculation.

FIG. 34 is a chart showing the waveform of the filtered data signal SG3 output from the filter circuit 3 of FIG. 1. In FIG. 34, four filtered data signals SG3a, SG3b, SG3c, SG3d are illustrated in an overlapped form. The phases of the filtered data signals SG3a–SG3d are used for phase servo. FIG. 32 displays the values that are sampled at eight points of a single cycle of the filtered data signals SG3a–SG3d.

The phase of the input signal IN when sampling eight points of a cycle is obtained from equation 1.

$$X(k) = \sum_{n=0}^{7} x(n)\cos\left(\frac{\pi}{4}kn\right) - j\sum_{n=0}^{7} x(n)\sin\left(\frac{\pi}{4}kn\right) \quad 1$$

The phase of the fundamental wave is obtained in equation 2 by inserting k=1 into equation 1.

$$X(1) = \sum_{n=0}^{7} x(n)\cos\left(\frac{\pi}{4}n\right) - j\sum_{n=0}^{7} x(n)\sin\left(\frac{\pi}{4}n\right) \quad 2$$

Equation 2 is expanded to obtain equation 3.

$$X(1) = \left(x(0) + \frac{1}{\sqrt{2}}x(1) + 0x(2) - \frac{1}{\sqrt{2}}x(3) - x(4) - \frac{1}{\sqrt{2}}x(5) + 0x(6) + \frac{1}{\sqrt{2}}x(7)\right) - j\left(0x(0) \frac{1}{\sqrt{2}}x(1) + x(2) + \frac{1}{\sqrt{2}}x(3) - 0x(4) - \frac{1}{\sqrt{2}}x(5) - x(6) - \frac{1}{\sqrt{2}}x(7)\right) \quad 3$$

Further, equation 4 is obtained from equation 3.

$$X(1) = \left((x(0) - x(4)) + \frac{1}{\sqrt{2}}(x(1) - x(3) - x(5) + x(7))\right) - j\left((x(2) - x(6)) + \frac{1}{\sqrt{2}}(x(1) + x(3) - x(5) - x(7))\right) \quad 4$$

The conventional DFT operational circuit calculates the phase of the fundamental wave of each of the signals SG3a–SG3d from the real-number part and the imaginary-number part of equation 4. The calculation history of equation 4 is illustrated in FIG. 33. In FIG. 33, phase P1 represents the phase of the fundamental wave of the signals SG3a–SG3d that is obtained from equation 4. The phase difference PD1 is the phase difference between the fundamental waves of each signal (i.e., the phase difference between the first and second signals SG3a and SG3b, the phase difference between the second and third signals SG3b and SG3c, and the phase difference between the third and fourth signals SG3c and, SG3d). The phase difference PD2 is the phase difference between the fundamental wave of the first signal SG3a and each of the fundamental waves of the second to fourth signals SG3b–SG3d.

Figures 36, 37:
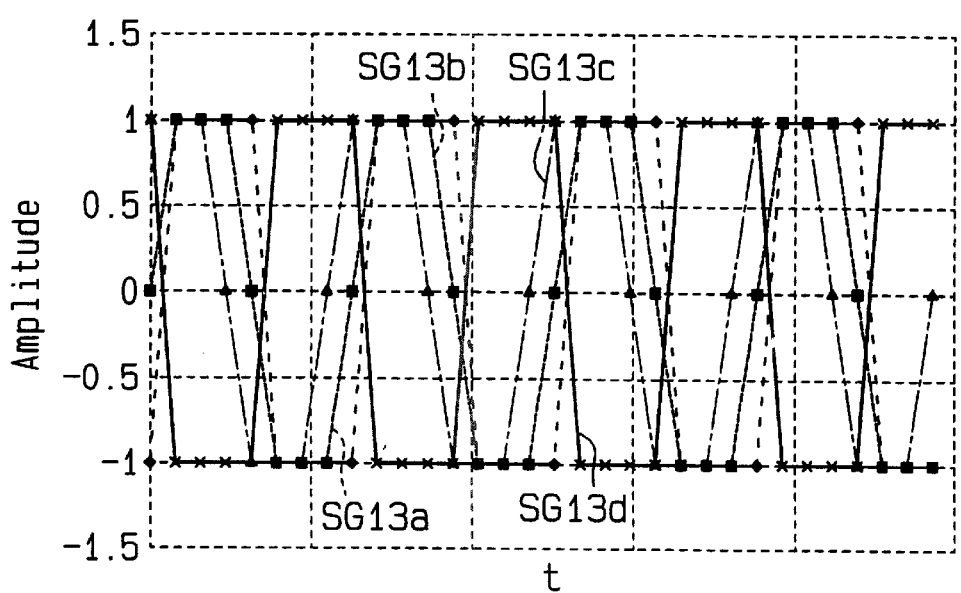
FIG. 36 is a table illustrating phase calculation in accordance with the output of the comparator of FIG. 35.
FIG. 37 is a waveform chart illustrating the output of the comparator of FIG. 35.

FIGS. 35 to 37 illustrate the phase calculation performed in the eighth embodiment.

FIG. 37 is a chart showing the waveform of the three-value determination signal SG13, which is output from the comparator 122. Further, FIG. 37 illustrates the four signals SG13a–SG13d (FIG. 24), which have different phases and are used for phase servo. FIG. 35 illustrates the values obtained by sampling each of the determination signals SG13a–SG13d at eight points of a cycle.

The DFT operational circuit 125 calculates the phases of the fundamental waves of the signals SG13a–SG13d from the real-number part and the imaginary-number part of equation 4. The calculation history of equation 4 is shown in FIG. 36. In FIG. 36, phase P1 is the phase of the fundamental wave of each of the signals SG13a–SG13d obtained from equation 4. The phase difference PD1 is the phase difference between the fundamental waves of two signals (i.e., the phase difference between the first and second signals SG13a and SG13b, the phase difference between the second and third signals SG13b and SG13c, and the phase difference between the third and fourth signals SG13c and SG13d). The phase difference PD2 is the phase difference between the fundamental wave of the first signal SG13a and each of the fundamental waves of the second to fourth signals SG13b–SG13d.

In this manner, the phase calculator 108 handles a small number of data bits. Thus, the circuit configuration of the DFT operational circuit 125 is simple.

A phase calculation result having high accuracy may be obtained by increasing the number of samples in each cycle. A highly accurate phase calculation result may also be obtained by increasing the data value (bit numbers) of the determination signal SG13. For example, the comparator 122 may use a third threshold value TH3 (0) in addition to the first and second threshold values TH1 (0.2), TH2 (−0.2). In this case, the comparator 122 generates the determination signal SG13 having data "0" when the sampled level of the amplified input signal SG12 is lower than the second threshold value TH2. If the sampled level of the amplified input signal SG12 is between the second and third threshold values TH3, TH1, the comparator 122 generates the determination signal SG13 having data "1". If the sampled level of the amplified input signal SG12 is between the third and first threshold values TH3, TH1, the comparator 122 generates the determination signal SG13 having data "2". If the sampled level of the amplified input signal SG12 is greater than the first threshold value TH1, the comparator 122 generates the determination signal SG13 having data "3". In other words, the comparator 122 generates the determination signal SG13 from a data string of four values.

Figure 40:
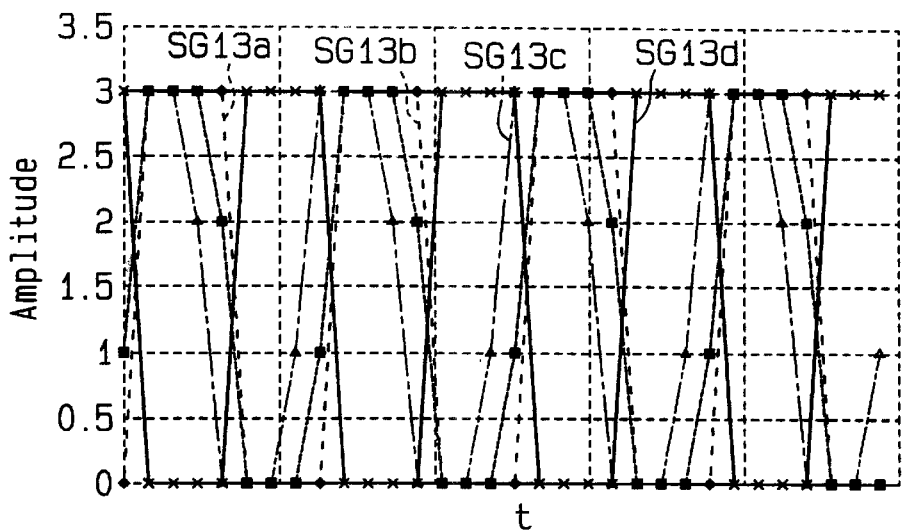
FIG. 40 is a waveform diagram of the output of the comparator of FIG. 38.

FIGS. 38 to 40 illustrate the phase calculation of a four-value determination signal SG13.

FIG. 40 is a waveform chart of the determination signal having four-value data strings. In FIG. 40, four filtered data signals SG13a, SG13b, SG13c, SG13d having difference phases are illustrated in an overlapped form. FIG. 38 illustrates the sampling level of the determination signals SG13a–SG13d.

With reference to FIG. 39, an operational phase calculation result that is close to the calculation result of FIG. 33 is obtained by using the determination signal SG13, which is formed by the four-value data values. In other words, a phase calculation result having higher accuracy is obtained.

The testing of the phase calculator 108 will now be discussed.

Figure 41:
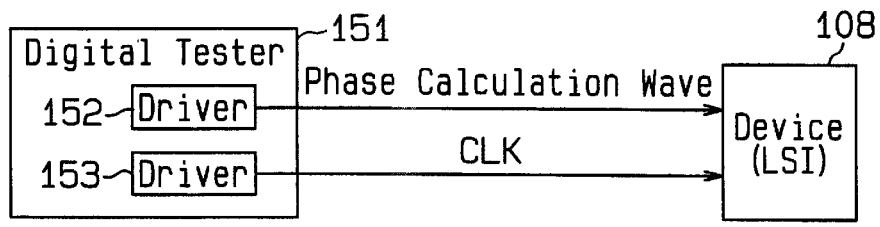
FIG. 41 is a schematic block circuit diagram illustrating the testing of the phase calculator.
Figure 42:
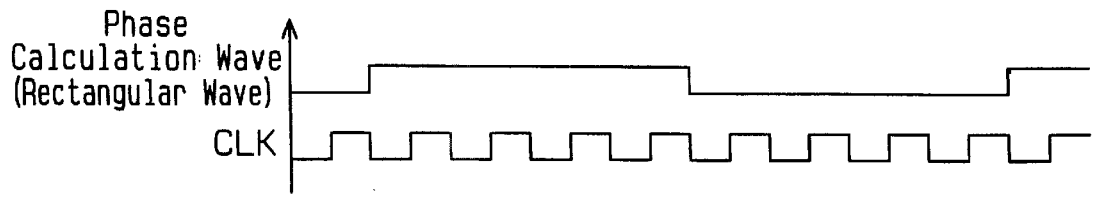
FIG. 42 is a waveform chart for testing the servo controller.

As shown in FIG. 41, when testing the phase calculator 108, the phase calculator 108 is connected to a digital tester 151. The digital tester 151 includes first and second drivers 152, 153. The first driver 152 generates a phase calculation wave, which is a rectangular wave, and provides the phase calculator 108 with the phase calculation wave. The second driver 153 generates a clock signal CLK (FIG. 42), which is used to perform the phase calculation, and provides the phase calculator 108 with the clock signal CLK.

The phase calculator 108 calculates the phase of the signal D1 (FIG. 27), which includes two values (1, −1). Accordingly, the phase calculator 108 may be tested by using the digital tester 151, which includes the first driver 152 to generate the phase calculation waveform (rectangular wave) having a signal level of two values. A waveform generator, which is expensive, is necessary to generate a sine wave when testing the conventional servo controller. The digital tester 151 is less expensive than a waveform generator. This reduces testing costs.

The phase calculator 108 of the eighth embodiment has the advantages described below.

(1) The amplifier 121 functions only to amplify the input signal IN. Thus, the analog circuits of the amplifier 121 are not required to perform high-speed operation. This simplifies the analog circuits.

(2) The amplifier 121 generates the amplified input signal SG12 with a gain that causes the amplified input signal to be excluded from the input range of the comparator 122. In this way the peak level of the amplified input signal is greater than the determination level, or the determination range. Accordingly, even if noise mixes with the amplified input signal SG12, the influence of noise on the determination of the comparator 122 is reduced. This facilitates the manufacture of a system LSI, which includes the phase calculator 108.

(3) The comparator 122 converts the amplified input signal SG12 to a three-value digital data signal string (determination signal SG13). Thus, the DFT operational circuit 125 calculates the phase difference with the phase calculation signal SG15, which has a small number of bit numbers. This reduces the scale of the DFT operational circuit 125.

(4) The median value correction circuit 123a counts the number of data values "1" and "−1" of the determination signal SG13 and compares the counted numbers to determine whether the determination signal SG13 has the proper data string. In accordance with the difference between the number of data values "1" and the number of data values "−1", the median value correction circuit 123a generates the correction signal SG14 to substantially match the median value of the amplified input signal SG12 with the median value of the input range of the comparator 122. The D/A converter 124 converts the correction signal SG14 to an analog signal to generate the correction voltage SG11 and supplies the amplifier 121 with the correction voltage SG11. The amplifier 121 adds the correction voltage SG11 to the amplified signal to generate the amplified input signal SG12. As a result, the offset amount of the amplifier 121 is adjusted to correct the median value of the amplified input signal SG12. Thus, a data string that is optimal for phase calculation is easily obtained.

(5) The median value fluctuating frequency of the amplified input signal SG12 is lower than the frequency of the input signal IN. Thus, the D/A converter 124 does not have to operate at a high speed in accordance with the frequency of the input signal IN, and functions only when it is required to correct the offset amount of the amplifier circuit 121. This facilitates the structure of the D/A converter 124.

(6) The data string correction circuit 123b obtains the absolute value of the difference between the bits of the correction data string DA, which is the determination signal SG13, and the bits of the reference data strings D1, D2. When the sum is less than or equal to the sum, the phase calculation signal SG15 is generated in accordance with the reference data string (D1 or D2). Thus, complicated calculations are not necessary and the phase calculation signal SG15 is easily generated.

It should be apparent to those skilled in the art that the present invention may be embodied in many other forms without departing from the principle and the scope of the invention. Particularly, it should be understood that the present invention may be embodied in the following forms.

(a) In the eighth embodiment, the median value of the amplified input signal SG12 may be corrected by using a signal (servo mark) read from the servo mark segment.

Figures 43, 44:
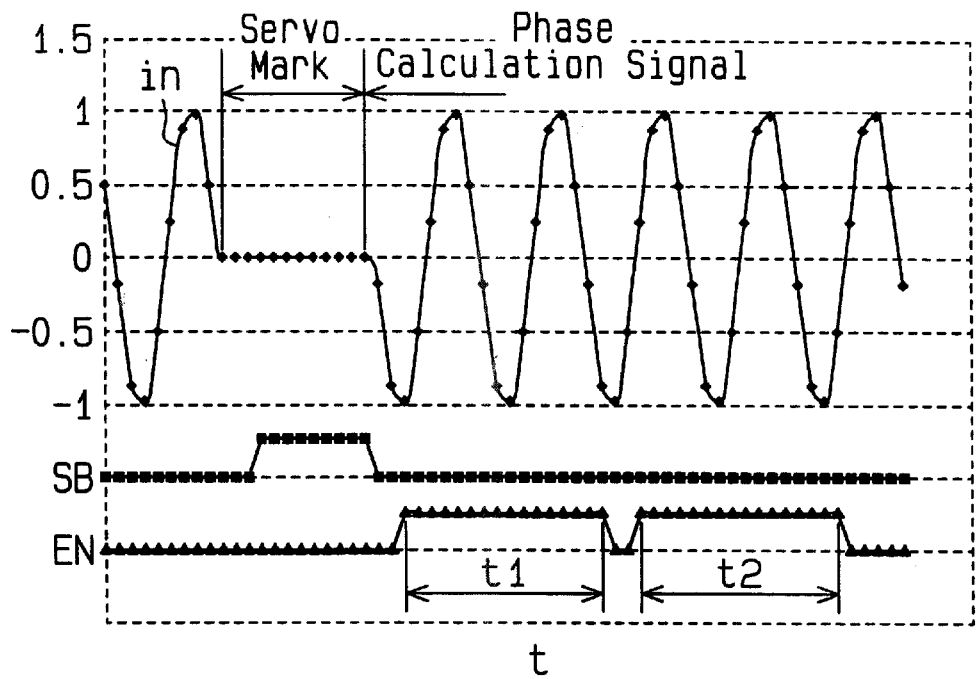
FIG. 43 is a diagram illustrating a further media value correction.
FIG. 44 is a first diagram illustrating a further phase calculation.

FIG. 43 illustrates a signal waveform obtained when the servo section of the recording medium is read. The servo mark is a null-amplitude (or small amplitude) waveform. When the servo mark is provided to the comparator 122 of FIG. 22, the determination signal SG13 is formed by consecutive data values of "0". When the number of the consecutive data values "0" is greater than or equal to a predetermined number (e.g., three samples), a servo mark detection signal SB having a high level is generated, as shown in FIG. 43. In accordance with the high servo mark detection signal SB, an A/D converter (not shown) converts the input signal IN to a digital signal IN. The digital signal is stored in a storage device, such as a memory. The digital signal includes information of the offset value of the amplifier 121. The median value of the amplified input signal SG12 (the offset value of the amplifier 121) is corrected by providing the correction signal SG14, which decreases the offset value of the digital signal, to the D/A converter 124 of FIG. 22.

In this manner, the offset value of the amplifier 121 is corrected based on the servo mark signal read from the servo mark segment by the read head before the position detection segment. Thus, only data string correction and DFT calculation is required to be performed by the signal IN read from the phase detection segment. This decreases the time required to calculate the phase difference. As a result, data is read readily at a high speed.

In this case, the A/D converter generates and outputs the correction signal SG14 before the servo mark is completed. That is, the A/D converter need only hold and convert the output signal SG12 of the amplifier 121 in response to the high servo mark detection signal SB, without having to perform a high-speed conversion. Thus, the circuit configuration of the A/D converter is simplified and the formation of analog circuits included in the A/D converter is facilitated.

(b) In the eighth embodiment, the median value of the amplified input signal SG12 may be corrected in accordance with the phase calculation result of the DFT operational circuit 125.

For example, signals X1, X2 having a predetermined phase difference of A are written to the recording medium. When the phase difference is "A±B" and value B is a large value (outside a tolerated range), the median value is increased or decreased. The phase is then recalculated. If the phase difference is "A±C", the median value is determined when value C is zero, or becomes small (within a tolerated range). This enables correction of the median value.

Referring to FIG. 43, periods t1, t2, during which the enable signal EN is high, correspond to phase calculation periods. The two periods t1, t2 correspond to two cycles of the input signal IN. The first phase calculation period and the second phase calculation period are offset by two samples. Thus, the calculated phase difference is as described below.

$$(360°/8) \times 2 = 90°$$

The phase difference of the input signal IN read from the first and second phase detection fields is calculated. The signal (code) SG14 provided to the D/A converter 124 is adjusted and the median value of the amplified input signal SG12 is corrected, so that the calculation result is within 90°±T (T representing the tolerable range).

(c) The DFT operational circuit 125 of the eighth embodiment may calculate the phases based on whether the codes of the real-number and imaginary-number components are negative or positive, and whether the values of the real number and imaginary number components are high or low without using an arc tangent (ARCTAN) calculation.

Figures 45, 46:
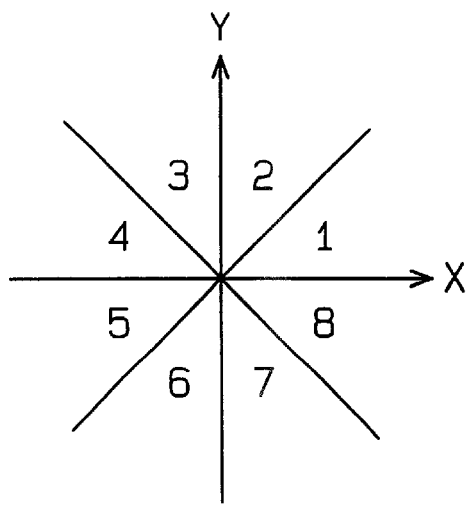
FIG. 45 is a second diagram illustrating a further phase calculation.
FIG. 46 is a third diagram illustrating a further phase calculation.

A plane, in which X-axis component corresponds to the real-number components and Y-axis component corresponds to the imaginary-number components, is divided into four based on whether the real number and imaginary number components are positive or negative. The plane is further divided into eight based on the values of the real-number and imaginary-number components. The plane is then further divided into 16 based on whether the ratio of the real-number and imaginary-number components are greater than or less than two. In other words, the plane is divided by $2^{n+3}$ in accordance with whether the ratio of the real-number and imaginary-number components is greater than or less than $2^n$. FIG. 45 illustrates an example in which the X-Y plane is divided into eight based on the codes and values of the real-number and imaginary-number components.

In FIG. 45, X corresponds to the real-number components and Y corresponds to the imaginary-number components. The divided eight sections each represent a phase, or angle. Thus, the phase of each section is as follows:

1=0° to 45°, 2=45° to 90°, 3=90° to 135°, 4=135° to 180°, 5=−180° to −135°, 6=−135° to −90°, 7=−90° to −45°, and 8=−45° to 0°.

It is determined in which section the values of the real-number and imaginary-number values are included through the procedures illustrated in FIG. 44. The phase difference is calculated in accordance with the determination result. Such calculation result (phase difference) includes error. However, the error may be decreased by increasing the number of the divided sections. In other words, the number of the divided sections may be increased in accordance with the calculation accuracy required for phase servo. That is, a calculation circuit may be formed in accordance with the calculation accuracy required for phase servo.

(d) In the eighth embodiment, the phase of the amplified input signal SG12 may be directly obtained in accordance with the phase of the sampling starting point, at which sampling of the amplified input signal SG12 is started.

FIG. 46 illustrates the relationship between the data of the reference data strings D1, D2 and the sampling starting point (phase).

For example, when the corrected data string of the sampled, amplified input signal SG12 is "−1, −1, −1, 0, 1, 1, 1, 0, −1, −1, −1, 0, 1, 1, 1, 0", the corrected data string and the reference data string D2 are matched starting from the second bit from the left of the data string D2 of FIG. 46. Thus, the phase of the starting point of the corrected data string is 135°, and the phase of the fundamental wave of the amplified input signal SG12 is 135°.

In the same manner, the relationship between the data and the phase is as described below.

The phase of "1, 1, 0, −1, −1, −1, 0, 1, 1, 1, 0, −1, −1, −1, 0, 1" is 0°, the phase of "1, 0, −1, −1, −1, 0, 1, 1, 1, 0, −1, −1, −1, 0, 1, 1" is 45°, the phase of "0, −1, −1, −1, 0, 1, 1, 1, 0, −1, −1, −1, 0, 1, 1, 1" is 45°, and the phase of "−1, 0, 1, 1, 1, 0, −1, −1, −1, 0, 1, 1, 1, 0, −1, −1" is −135°.

Further, if the corrected data string is "−1, −1, −1, 1, 1, 1, 1, 1, −1, −1, −1, −1, 1, 1, 1, 1", the phase of the reference data string D1 is 112.5°. The phase of "−1, −1, 1, 1, 1, 1, −1, −1, −1, −1, 1, 1, 1, 1, −1, −1" is −157.5°.

(e) The structure of the phase calculator 108 of the eighth embodiment may be changed as required. For example, a low-pass filter, which passes the fundamental wave, may be connected between the amplifier 121 and the comparator 122.

(f) In the eighth embodiment, the number of samples in each cycle of the input signal IN may be changed when necessary. In such case, equations (1) to (4) and the data strings D1, D2 are changed accordingly.

The present examples and embodiments are to be considered as illustrative and not restrictive, and the invention is not to be limited to the details given herein, but may be modified within the scope and equivalence of the appended claims.

What is claimed is:

1. A method for calculating a phase of a signal, the method comprising:
   generating an amplified input signal, which includes a fundamental wave of an input signal, by amplifying the input signal with a high gain;
   converting the amplified input signal to a multiple-value digital signal using at least one determination level, wherein the determination level is lower than the peak of the amplified input signal; and
   calculating the phase of the fundamental wave of the input signal using the digital signal.

2. A method for calculating a phase of a signal, the method comprising:
   generating an amplified input signal, which includes a fundamental wave of an input signal by amplifying the input signal with a high gain, wherein the amplitude of the amplified input signal is greater than a predetermined determination range;
   converting the amplified input signal to a digital signal having at least two values in accordance with the determination range; and
   calculating the phase of the fundamental wave of the input signal using the digital signal.

3. A phase calculator for calculating a phase of a signal, the phase calculator comprising:
   an amplifier for generating an amplified input signal, which includes a fundamental wave of an input signal, by amplifying the input signal with a predetermined gain;
   a comparator connected to the amplifier, wherein the comparator compares at least one determination level with the amplified input signal to generate a determination signal having a digital data string that includes two or more values; and
   a phase calculation circuit connected to the comparator, wherein the phase calculation circuit calculates the phase of the input signal in accordance with the determination signal, wherein the determination level includes a maximum value and a minimum value, and the predetermined gain of the amplifier is set so that the amplitude of the amplified input signal exceeds the maximum and minimum values of the determination level.

4. A phase calculator for calculating a phase of a signal, the phase calculator comprising:
   an amplifier for generating an amplified input signal, which includes a fundamental wave of an input signal, by amplifying the input signal with a predetermined gain;
   a comparator connected to the amplifier, wherein the comparator compares the amplified input signal with a predetermined input range to generate a determination signal having a digital data string that includes two or more values; and
   a phase calculation circuit connected to the comparator, wherein the phase calculation circuit calculates the phase of the input signal in accordance with the determination signal, wherein the gain of the amplifier is set so that the amplitude of the amplified input signal is excluded from the input range.

5. The phase calculator according to claim 4, wherein the phase calculation circuit calculates the phase of a signal read from a recording medium, and the recording medium includes a servo section having a servo mark segment and a phase detection segment, the phase detection segment including a plurality of fields, each of which records a signal having a different phase, and wherein the input signal is one of a plurality of signals having different phases and read from the fields.

6. The phase calculator according to claim 5, further comprising:
   a median value correction circuit connected to the comparator, wherein the median value correction circuit generates a correction signal for substantially matching the median value of the amplified input signal with the median value of a comparison range of the comparator in accordance with the determination signal provided from the comparator; and
   a D/A converter connected to the median value correction circuit, wherein the D/A converter generates from the correction signal an analog signal having a correction voltage, and provides the analog signal correction voltage to the amplifier, and wherein the amplifier adds the correction voltage to the amplified input signal.

7. The phase calculator according to claim 6, wherein the input signal is one of a plurality of signals having different phases, the phase calculation circuit calculates the phases of the plurality of signals, and the median value correction circuit generates the correction signal so that a difference between the calculated phases of the signals becomes equal to a predetermined value.

8. The phase calculator according to claim 6, wherein the input signal includes a servo mark signal read from the servo mark segment, the servo mark signal having a constant voltage, which has a substantially null level, and wherein the median value correction circuit detects an offset value of the amplifier and generates a correction value to decrease the offset value.

9. The phase calculator according to claim 6, wherein the median value correction circuit counts the number of times the determination signal reaches a maximum value and counts the number of times the determination signal reaches a minimum value and, when the counted values differ, generates the correction signal so that the two count values are matched.

10. The phase calculator according to claim 9, further comprising:
a data string correction circuit connected to the comparator, wherein the data string correction circuit corrects the determination signal and generates a phase calculation signal, and wherein the data string correction circuit selects one of a plurality of reference data strings in accordance with a determination signal and uses the selected reference data string to correct the determination signal.

11. The phase calculator according to claim 10, wherein the data string correction circuit selects one of the plurality of reference data strings based on whether a predetermined value is included in the determination signal.

12. The phase calculator according to claim 11, wherein each of the plurality of reference data strings and the determination signal include data cycles which repeat the data bit string for every predetermined number of data bits, each of the plurality of reference data strings including a number of bits that is greater than the number of data bits included in the determination signal by a number of bits corresponding to one data cycle, and wherein the data string correction circuit shifts the selected reference data string one bit at a time to obtain an absolute value of a sum of a difference between the bits of the determination signal and the bits of the reference data string, the phase calculation signal being generated from the selected reference data string when the sum is smallest.

13. The phase calculator according to claim 12, wherein the phase calculation circuit includes a discrete Fourier transform (DFT) operational circuit, and wherein the DFT operational circuit obtains a real-number component and an imaginary-number component of a fundamental wave of a determination signal and calculates a phase of the input signal from an arc tangent of the real-number and imaginary-number components.

14. The phase calculator according to claim 12, wherein the phase calculation circuit includes a DFT operational circuit, and wherein the DFT operational circuit obtains a real-number component and an imaginary-number component of a fundamental wave of a determination signal and divides a plane, in which the real-number component corresponds to an X-axis component and the imaginary-number component corresponds to a Y-axis component, into a plurality of sections in accordance with the codes and values of the real-number and imaginary-number components, wherein the DFT operational circuit further determines in which one of the plurality of sections the data of the real-number and imaginary-number components is included and calculates a phase corresponding to the section including the data as the phase of the input signal.

15. The phase calculator according to claim 12, wherein the determination signal is generated by sampling the amplified input signal and the phase of each bit of the selected reference data string corresponds to the phase of a sampling point of the amplified input signal, wherein the phase calculation circuit compares the bits of the selected reference data string to the bits of the phase calculation signal to determine the phase of the bit of the selected reference data string corresponding to a starting point of the phase calculation signal, and calculates the phase of the input signal in accordance with the determined phase.

16. The phase calculator according to claim 4, further comprising:
a median value correction circuit connected to the comparator, wherein the median value correction circuit generates a correction signal for substantially matching the median value of the amplified input signal with the median value of a comparison range of the comparator in accordance with the determination signal provided from the comparator; and
a D/A converter connected to the median value correction circuit, wherein the D/A converter generates from the correction signal an analog signal having a correction voltage, and provides the analog signal correction voltage to the amplifier, and wherein the amplifier adds the correction voltage to the amplified input signal.

17. The phase calculator according to claim 16, wherein the input signal is one of a plurality of signals having different phases, the phase calculation circuit calculates the phases of the plurality of signals, and the median value correction circuit generates the correction signal so that a difference between the calculated phases of the signals becomes equal to a predetermined value.

18. The phase calculator according to claim 16, wherein the median value correction circuit counts the number of times the determination signal reaches a maximum value and counts the number of times the determination signal reaches a minimum value and, when the counted values differ, generates the correction signal so that the two count values are matched.

19. The phase calculator according to claim 18, further comprising:
a data string correction circuit connected to the comparator, wherein the data string correction circuit corrects the determination signal and generates a phase calculation signal, and wherein the data string correction circuit selects one of a plurality of reference data strings in accordance with a determination signal and uses the selected reference data string to correct the determination signal.

20. The phase calculator according to claim 19, wherein the data string correction circuit selects one of the plurality of reference data strings based on whether a predetermined value is included in the determination signal.

21. The phase calculator according to claim 20, wherein each of the plurality of reference data strings and the determination signal include data cycles which repeat the data bit string for every predetermined number of data bits, each of the plurality of reference data strings including a number of bits that is greater than the number of data bits included in the determination signal by a number of bits corresponding to one data cycle, and wherein the data string correction circuit shifts the selected reference data string one bit at a time to obtain an absolute value of a sum of a difference between the bits of the determination signal and the bits of the selected reference data string, the phase calculation signal being generated from the selected reference data string when the sum is smallest.

22. The phase calculator according to claim 21, wherein the phase calculation circuit includes a discrete Fourier transform (DFT) operational circuit, and wherein the DFT operational circuit obtains a real-number component and an imaginary-number component of a fundamental wave of a determination signal and calculates a phase of the input signal from an arc tangent of the real-number and imaginary-number components.

23. The phase calculator according to claim 21, wherein the phase calculation circuit includes a DFT operational circuit, and wherein the DFT operational circuit obtains a real-number component and an imaginary-number component of a fundamental wave of a determination signal and divides a plane, in which the real-number number component corresponds to an X-axis component and the imaginary-number component corresponds to a Y-axis component, into a plurality of sections in accordance with the codes and values of the real-number and imaginary-number components, wherein the DFT operational circuit further determines in which one of the plurality of sections the data of the real-number and imaginary-number components is included, and calculates a phase corresponding to the section including the data as the phase of the input signal.

24. The phase calculator according to claim 23, wherein the determination signal is generated by sampling the amplified input signal and the phase of each bit of the selected reference data string corresponds to the phase of a sampling point of the amplified input signal, wherein the phase calculation circuit compares the bits of the selected reference data string to the bits of the phase calculation signal to determine the phase of the bit of the selected reference data string corresponding to a starting point of the phase calculation signal and calculates the phase of the input signal in accordance with the determined phase.

25. A method for testing a phase calculator, wherein the phase calculator amplifies an input signal with a predetermined gain to generate an amplified input signal, compares the amplified input signal with at least one determination level, generates a digital data string having two or more values, and calculates a phase of the input signal with the digital data string, wherein the testing method comprises:

connecting a digital signal generator to the phase calculator, wherein the digital signal generator generates a rectangular wave; and providing the rectangular wave as the input signal to the phase calculator, wherein the functions of the phase calculator are tested in accordance with the rectangular wave.

* * * * *